(12) United States Patent
Feldman et al.

(10) Patent No.: US 9,293,716 B2
(45) Date of Patent: Mar. 22, 2016

(54) COMPOSITIONS FOR ELECTRONIC APPLICATIONS

(75) Inventors: Jerald Feldman, Wilmington, DE (US); Norman Herron, Newark, DE (US); Michael Henry Howard, Jr., Montchanin, DE (US); Nora Sabina Radu, Landenberg, PA (US); Vsevolod Rostovtsev, Swarthmore, PA (US); Kerwin D Dobbs, Wilmington, DE (US); Adam Fennimore, Wilmington, DE (US); Weiying Gao, Landenberg, PA (US); Weishi Wu, Landenberg, PA (US); Ying Wang, Wilmington, DE (US); Charles D McLaren, Landenberg, PA (US)

(73) Assignee: EI DU PONT DE NEMOURS AND COMPANY, Wilmington, DE (US)

(*) Notice: Subject to any disclaimer, the term of this patent is extended or adjusted under 35 U.S.C. 154(b) by 306 days.

(21) Appl. No.: 13/990,832

(22) PCT Filed: Dec. 19, 2011

(86) PCT No.: PCT/US2011/065883
§ 371 (c)(1),
(2), (4) Date: May 31, 2013

(87) PCT Pub. No.: WO2012/087955
PCT Pub. Date: Jun. 28, 2012

(65) Prior Publication Data
US 2013/0248849 A1  Sep. 26, 2013

Related U.S. Application Data

(60) Provisional application No. 61/424,955, filed on Dec. 20, 2010.

(51) Int. Cl.
| | |
|---|---|
| *H01L 51/54* | (2006.01) |
| *C09K 11/06* | (2006.01) |
| *H01L 51/00* | (2006.01) |
| *H05B 33/14* | (2006.01) |
| *H01L 51/05* | (2006.01) |
| *H01L 51/50* | (2006.01) |

(52) U.S. Cl.
CPC ............ *H01L 51/0085* (2013.01); *C09K 11/06* (2013.01); *H01L 51/0067* (2013.01); *H01L 51/0072* (2013.01); *H01L 51/0074* (2013.01); *H01L 51/0087* (2013.01); *H05B 33/14* (2013.01); *C09K 2211/1029* (2013.01); *C09K 2211/1059* (2013.01); *H01L 51/0558* (2013.01); *H01L 51/5016* (2013.01); *H01L 2251/5384* (2013.01)

(58) Field of Classification Search
None
See application file for complete search history.

(56) References Cited

U.S. PATENT DOCUMENTS

| | | |
|---|---|---|
| 3,282,875 A | 11/1966 | Connolly et al. |
| 3,849,458 A | 11/1974 | Dinh-Nguyen |
| 4,053,311 A | 10/1977 | Limburg et al. |
| 4,358,545 A | 11/1982 | Ezzell et al. |
| 4,940,525 A | 7/1990 | Ezzell |
| 5,247,190 A | 9/1993 | Friend et al. |
| 5,254,633 A | 10/1993 | Han |
| 5,378,519 A | 1/1995 | Kikuchi et al. |
| 5,408,109 A | 4/1995 | Heeger et al. |
| 5,707,747 A | 1/1998 | Tomiyama et al. |

(Continued)

FOREIGN PATENT DOCUMENTS

| | | |
|---|---|---|
| CN | 1668719 A | 9/2005 |
| CN | 1711334 A | 12/2005 |

(Continued)

OTHER PUBLICATIONS

Machine translation of KR2010-131745. Date of publication: Dec. 16, 2010.*
Colon et al, "High Molecular Weight Aromatic Polymers by Nickel Coupling of Aryl Polychlorides", Journal of Polymer Science, Part A, Polymer Chemistry Edition, 1990, vol. 28, pp. 367-383.
Constantini et al, "Infrared Spectroscopic Study of Polaron Formation in Electrochemically Synthesized Poly(3-Alkylpyrroles),"Phys. Chem. Chem. Phys., 2003, vol. 5, pp. 749-757.

(Continued)

*Primary Examiner* — Andrew K Bohaty

(57) ABSTRACT

This invention relates to a composition including (a) a dopant, (b) a first host having at least one unit of Formula I, and (c) a second host compound. Formula I has the structure

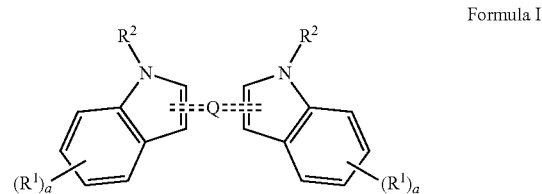

Formula I where Q is a fused ring linkage having the formula

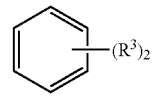

In Formula I: $R^1$ is the same or different at each occurrence and is D, alkyl, aryl, silyl, alkoxy, aryloxy, cyano, vinyl, or allyl; $R^2$ is the same or different at each occurrence and is H, D, alkyl, or aryl, or both $R^2$ are an N-heterocycle; $R^3$ is the same or different at each occurrence and is H, D, cyano, alkyl or aryl; and a is the same or different at each occurrence and is an integer from 0-4.

10 Claims, 3 Drawing Sheets

(56) References Cited

U.S. PATENT DOCUMENTS

| | | |
|---|---|---|
| 5,911,918 A | 6/1999 | Shacklette et al. |
| 5,929,194 A | 7/1999 | Woo et al. |
| 5,936,259 A | 8/1999 | Katz et al. |
| 5,942,340 A | 8/1999 | Hu et al. |
| 5,962,631 A | 10/1999 | Woo et al. |
| 6,150,426 A | 11/2000 | Howard et al. |
| 6,259,202 B1 | 7/2001 | Sturm et al. |
| 6,303,238 B1 | 10/2001 | Thompson et al. |
| 6,579,630 B2 | 6/2003 | Li et al. |
| 6,670,645 B2 | 12/2003 | Grushin et al. |
| 6,677,060 B2 | 1/2004 | Li et al. |
| 6,686,067 B2 | 2/2004 | Li et al. |
| 6,852,429 B1 | 2/2005 | Li et al. |
| 6,872,475 B2 | 3/2005 | Chen et al. |
| 6,875,524 B2 | 4/2005 | Hatwar et al. |
| 6,902,833 B2 | 6/2005 | Thompson et al. |
| 6,953,705 B2 | 10/2005 | Prakash |
| 7,023,013 B2 | 4/2006 | Ricks et al. |
| 7,075,102 B2 | 7/2006 | Grushin et al. |
| 7,125,952 B2 | 10/2006 | O'Dell et al. |
| 7,173,131 B2 | 2/2007 | Saitoh et al. |
| 7,189,989 B2 | 3/2007 | Ise |
| 7,211,202 B2 | 5/2007 | Korzhenko |
| 7,235,420 B2 | 6/2007 | Prakash et al. |
| 7,351,358 B2 | 4/2008 | Hsu et al. |
| 7,358,409 B2 | 4/2008 | Saitoh et al. |
| 7,362,796 B2 | 4/2008 | Shigeno |
| 7,365,230 B2 | 4/2008 | Herron et al. |
| 7,375,250 B2 | 5/2008 | Saitoh et al. |
| 7,390,438 B2 | 6/2008 | Hsu et al. |
| 7,402,681 B2 | 7/2008 | Ong et al. |
| 7,431,866 B2 | 10/2008 | Hsu et al. |
| 7,456,424 B2 | 11/2008 | Wu et al. |
| 7,462,298 B2 | 12/2008 | Hsu et al. |
| 7,491,450 B2 | 2/2009 | Okinaka et al. |
| 7,528,542 B2 | 5/2009 | Kawamura et al. |
| 7,540,978 B2 | 6/2009 | Pfeiffer et al. |
| 7,586,006 B2 | 9/2009 | Funahashi |
| 7,642,380 B2 | 1/2010 | Funahashi |
| 7,651,786 B2 | 1/2010 | Matsuura et al. |
| 7,651,788 B2 | 1/2010 | Seo et al. |
| 7,709,104 B2 | 5/2010 | Saitoh et al. |
| 7,722,785 B2 | 5/2010 | Hsu et al. |
| 7,745,017 B2 | 6/2010 | Nakamura et al. |
| 7,887,933 B2 | 2/2011 | Kathirgamanathan et al. |
| 8,026,665 B2 | 9/2011 | Kim et al. |
| 8,062,769 B2 | 11/2011 | Kai et al. |
| 8,063,399 B2 | 11/2011 | Johansson et al. |
| 8,217,181 B2 | 7/2012 | Wang |
| 8,343,381 B1 | 1/2013 | Chesterfield |
| 2001/0026878 A1 | 10/2001 | Woo et al. |
| 2001/0053462 A1 | 12/2001 | Mishima |
| 2002/0048687 A1 | 4/2002 | Hosokawa et al. |
| 2002/0076576 A1 | 6/2002 | Li et al. |
| 2002/0155319 A1 | 10/2002 | Kawamura et al. |
| 2003/0072966 A1 | 4/2003 | Hosokawa et al. |
| 2003/0118866 A1 | 6/2003 | Oh et al. |
| 2003/0134140 A1 | 7/2003 | Li et al. |
| 2003/0138657 A1 | 7/2003 | Li et al. |
| 2003/0168970 A1 | 9/2003 | Tominaga et al. |
| 2003/0224205 A1 | 12/2003 | Li et al. |
| 2003/0227001 A1 | 12/2003 | Li et al. |
| 2004/0004433 A1 | 1/2004 | Lamansky et al. |
| 2004/0038459 A1 | 2/2004 | Brown et al. |
| 2004/0082250 A1 | 4/2004 | Haoto |
| 2004/0094768 A1 | 5/2004 | Yu et al. |
| 2004/0102577 A1 | 5/2004 | Hsu et al. |
| 2004/0106003 A1 | 6/2004 | Chen et al. |
| 2004/0106004 A1 | 6/2004 | Li |
| 2004/0121184 A1 | 6/2004 | Thompson et al. |
| 2004/0127637 A1 | 7/2004 | Hsu et al. |
| 2004/0209118 A1 | 10/2004 | Seo et al. |
| 2004/0263067 A1 | 12/2004 | Saitoh et al. |
| 2005/0031898 A1 | 2/2005 | Li et al. |
| 2005/0035335 A1 | 2/2005 | Han et al. |
| 2005/0063638 A1 | 3/2005 | Alger et al. |
| 2005/0064233 A1 | 3/2005 | Matsuura et al. |
| 2005/0073249 A1 | 4/2005 | Morii et al. |
| 2005/0088083 A1 | 4/2005 | Seo |
| 2005/0158577 A1 | 7/2005 | Ishibashi et al. |
| 2005/0184287 A1 | 8/2005 | Herron et al. |
| 2005/0186106 A1 | 8/2005 | Li et al. |
| 2005/0187411 A1 | 8/2005 | Herron et al. |
| 2005/0191776 A1 | 9/2005 | Lamansky et al. |
| 2005/0205860 A1 | 9/2005 | Hsu et al. |
| 2005/0244670 A1 | 11/2005 | Saitoh et al. |
| 2005/0245752 A1 | 11/2005 | Conley et al. |
| 2005/0280008 A1 | 12/2005 | Ricks et al. |
| 2006/0033421 A1 | 2/2006 | Matsuura et al. |
| 2006/0043858 A1 | 3/2006 | Ikeda et al. |
| 2006/0052641 A1 | 3/2006 | Funahashi |
| 2006/0076557 A1 | 4/2006 | Waller et al. |
| 2006/0103298 A1 | 5/2006 | Lee |
| 2006/0113528 A1 | 6/2006 | Okinaka et al. |
| 2006/0115678 A1 | 6/2006 | Saitoh et al. |
| 2006/0121312 A1 | 6/2006 | Yamada et al. |
| 2006/0124923 A1* | 6/2006 | Wu et al. ............... 257/40 |
| 2006/0127698 A1 | 6/2006 | Tokailin et al. |
| 2006/0128969 A1 | 6/2006 | Li et al. |
| 2006/0134459 A1 | 6/2006 | Huo |
| 2006/0152146 A1 | 7/2006 | Funahashi |
| 2006/0154107 A1 | 7/2006 | Kubota et al. |
| 2006/0158102 A1 | 7/2006 | Kawamura et al. |
| 2006/0159838 A1 | 7/2006 | Kowalski et al. |
| 2006/0194074 A1 | 8/2006 | Funahashi |
| 2006/0210830 A1 | 9/2006 | Funahashi |
| 2006/0216411 A1 | 9/2006 | Steudel et al. |
| 2006/0217572 A1 | 9/2006 | Kawamura et al. |
| 2006/0251925 A1 | 11/2006 | Hosokawa et al. |
| 2006/0267488 A1 | 11/2006 | Saitoh et al. |
| 2006/0284140 A1 | 12/2006 | Breuning et al. |
| 2007/0031588 A1 | 2/2007 | Nakayama |
| 2007/0031701 A1 | 2/2007 | Nakashima et al. |
| 2007/0032632 A1 | 2/2007 | Tsukioka et al. |
| 2007/0063638 A1 | 3/2007 | Tokairin et al. |
| 2007/0066755 A1 | 3/2007 | Hsu et al. |
| 2007/0079927 A1 | 4/2007 | Lamansky et al. |
| 2007/0087222 A1 | 4/2007 | Kim et al. |
| 2007/0096082 A1 | 5/2007 | Gaynor et al. |
| 2007/0114917 A1 | 5/2007 | Funahashi et al. |
| 2007/0134511 A1 | 6/2007 | Kawamura et al. |
| 2007/0155991 A1 | 7/2007 | Funahashi |
| 2007/0181874 A1 | 8/2007 | Prakash et al. |
| 2007/0189190 A1 | 8/2007 | Feng et al. |
| 2007/0205409 A1 | 9/2007 | Lecloux et al. |
| 2007/0215864 A1 | 9/2007 | Luebben et al. |
| 2007/0228364 A1 | 10/2007 | Radu et al. |
| 2007/0236137 A1 | 10/2007 | Funahashi |
| 2007/0247063 A1 | 10/2007 | Murase et al. |
| 2007/0252511 A1 | 11/2007 | Funahashi |
| 2007/0255076 A1 | 11/2007 | Ito et al. |
| 2007/0285009 A1 | 12/2007 | Kubota |
| 2007/0292713 A9 | 12/2007 | Dobbs et al. |
| 2007/0298530 A1 | 12/2007 | Feehery |
| 2008/0023676 A1 | 1/2008 | Hsu |
| 2008/0049413 A1 | 2/2008 | Jinde et al. |
| 2008/0067473 A1 | 3/2008 | Walker et al. |
| 2008/0071049 A1 | 3/2008 | Radu et al. |
| 2008/0086012 A1 | 4/2008 | Egawa et al. |
| 2008/0097076 A1 | 4/2008 | Radu et al. |
| 2008/0102312 A1 | 5/2008 | Parham et al. |
| 2008/0114178 A1 | 5/2008 | Kawakami et al. |
| 2008/0138655 A1 | 6/2008 | Lecloux et al. |
| 2008/0166566 A1 | 7/2008 | Prakash et al. |
| 2008/0191614 A1* | 8/2008 | Kim ............... C07B 59/001 313/504 |
| 2008/0233433 A1 | 9/2008 | Igarashi et al. |
| 2008/0286566 A1 | 11/2008 | Prakash |
| 2008/0286605 A1 | 11/2008 | Takeda |
| 2008/0297037 A1 | 12/2008 | Vestweber et al. |
| 2008/0303425 A1 | 12/2008 | Rostovtsev et al. |
| 2008/0303427 A1 | 12/2008 | Johansson et al. |
| 2008/0303428 A1 | 12/2008 | Rostovtsev et al. |
| 2009/0051281 A1 | 2/2009 | Inoue |

(56) References Cited

U.S. PATENT DOCUMENTS

| | | |
|---|---|---|
| 2009/0058279 A1 | 3/2009 | Takeda |
| 2009/0079334 A1 | 3/2009 | Kim et al. |
| 2009/0134781 A1 | 5/2009 | Jang et al. |
| 2009/0184635 A1 | 7/2009 | Pan et al. |
| 2009/0295274 A1 | 12/2009 | Hwang et al. |
| 2009/0302742 A1 | 12/2009 | Komori et al. |
| 2010/0108989 A1 | 5/2010 | Busing et al. |
| 2010/0148161 A1 | 6/2010 | Kai et al. |
| 2010/0148162 A1 | 6/2010 | Komori et al. |
| 2010/0187505 A1 | 7/2010 | Stoessel et al. |
| 2010/0187506 A1 | 7/2010 | Park et al. |
| 2010/0187977 A1 | 7/2010 | Kai et al. |
| 2010/0187983 A1 | 7/2010 | Herron et al. |
| 2010/0213825 A1 | 8/2010 | Park et al. |
| 2010/0314644 A2 | 12/2010 | Nishimura et al. |
| 2011/0037062 A1 | 2/2011 | Fukumatsu et al. |
| 2011/0062862 A1* | 3/2011 | Yamamoto et al. ........... 313/504 |
| 2011/0095269 A1 | 4/2011 | Zhang et al. |
| 2011/0095273 A1 | 4/2011 | Meng et al. |
| 2011/0121269 A1 | 5/2011 | Lecloux et al. |
| 2011/0147718 A1 | 6/2011 | Howard et al. |

FOREIGN PATENT DOCUMENTS

| | | |
|---|---|---|
| CN | 1768029 A | 5/2006 |
| CN | 1957646 A | 5/2007 |
| DE | 102005058557 A1 | 6/2007 |
| EP | 443861 B1 | 5/1995 |
| EP | 443861 A2 | 7/1995 |
| EP | 681019 A2 | 9/1999 |
| EP | 1061112 A1 | 12/2000 |
| EP | 765106 A2 | 11/2002 |
| EP | 1277824 A1 | 1/2003 |
| EP | 1317005 A2 | 6/2003 |
| EP | 1437395 A2 | 7/2004 |
| EP | 1491609 A2 | 12/2004 |
| EP | 1491610 A2 | 12/2004 |
| EP | 1541657 A1 | 6/2005 |
| EP | 1561794 A1 | 8/2005 |
| EP | 1604974 A1 | 12/2005 |
| EP | 1612202 A1 | 1/2006 |
| EP | 1624500 A1 | 2/2006 |
| EP | 1672713 A1 | 6/2006 |
| EP | 1718124 A1 | 11/2006 |
| EP | 1737277 A1 | 12/2006 |
| EP | 1792893 A1 | 6/2007 |
| EP | 1860096 A1 | 11/2007 |
| EP | 1932895 A1 | 6/2008 |
| EP | 1933603 A1 | 6/2008 |
| EP | 1956022 A1 | 8/2008 |
| EP | 1995292 A1 | 11/2008 |
| EP | 2080762 A1 | 7/2009 |
| EP | 2085450 A1 | 8/2009 |
| EP | 2093271 A1 | 8/2009 |
| EP | 2067766 A1 | 10/2009 |
| EP | 2067767 A1 | 10/2009 |
| EP | 2189508 A2 | 5/2010 |
| JP | 04175395 A | 6/1992 |
| JP | 07/249490 A | 9/1995 |
| JP | 08/053397 A | 2/1996 |
| JP | 08/167479 A | 6/1996 |
| JP | 10251633 A | 9/1998 |
| JP | 2000/186066 A | 7/2000 |
| JP | 2001/226331 A | 8/2001 |
| JP | 2003/238501 A | 8/2003 |
| JP | 2003/297582 A | 10/2003 |
| JP | 2003/338380 A | 11/2003 |
| JP | 2004-10550 A | 1/2004 |
| JP | 2004/071286 A | 3/2004 |
| JP | 2005/232452 A | 9/2005 |
| JP | 2006/016384 A | 1/2006 |
| JP | 2006/052323 A | 2/2006 |
| JP | 2006-151844 A | 6/2006 |
| JP | 2006/176493 A | 7/2006 |
| JP | 2006-219392 A | 8/2006 |
| JP | 2007-182432 A | 7/2007 |
| JP | 2007-186449 A | 7/2007 |
| JP | 2009-161470 A | 7/2009 |
| JP | 2009-246354 A | 10/2009 |
| KR | 10-2004-0079803 A | 9/2004 |
| KR | 10-2009-0046731 A | 5/2009 |
| KR | 10-2009-0086920 A | 8/2009 |
| KR | 10-2009-0093897 A | 9/2009 |
| KR | 10-2009-0086015 A | 10/2009 |
| KR | 2010131745 A * | 12/2010 |
| WO | 00/53565 A1 | 9/2000 |
| WO | 00/70655 A2 | 11/2000 |
| WO | 01/41512 A1 | 6/2001 |
| WO | 03/008424 A1 | 1/2003 |
| WO | 03/040257 A1 | 5/2003 |
| WO | 03040257 A1 | 5/2003 |
| WO | 03/063555 A1 | 7/2003 |
| WO | 03063555 A1 | 7/2003 |
| WO | 03/091688 A2 | 11/2003 |
| WO | 2004/016710 A1 | 2/2004 |
| WO | 2004016710 A1 | 2/2004 |
| WO | 2004/018587 A1 | 3/2004 |
| WO | 2005/000787 A1 | 1/2005 |
| WO | 2005/031889 A2 | 4/2005 |
| WO | 2005/049546 A1 | 6/2005 |
| WO | 2005/052027 A1 | 6/2005 |
| WO | 2006/025273 A1 | 3/2006 |
| WO | 2006/043087 A1 | 4/2006 |
| WO | 2006/063852 A1 | 6/2006 |
| WO | 2006/112582 A1 | 10/2006 |
| WO | 2006/121237 A1 | 11/2006 |
| WO | 2007/021117 A1 | 2/2007 |
| WO | 2007021117 A1 | 2/2007 |
| WO | 2007/065678 A1 | 6/2007 |
| WO | 2007/100096 A1 | 9/2007 |
| WO | 2007/105917 A1 | 9/2007 |
| WO | 2007/108666 A1 | 9/2007 |
| WO | 2008/011953 A1 | 1/2008 |
| WO | 2008/024378 A2 | 2/2008 |
| WO | 2008/024379 A2 | 2/2008 |
| WO | 2008025997 A1 | 3/2008 |
| WO | 2008/147721 A1 | 12/2008 |
| WO | 2008/149968 A1 | 12/2008 |
| WO | 2009/018009 A1 | 2/2009 |
| WO | 2009018009 A1 | 2/2009 |
| WO | 2009/028902 A2 | 3/2009 |
| WO | 2009/055628 A1 | 4/2009 |
| WO | 2009/067419 A1 | 5/2009 |
| WO | 2009067419 A1 | 5/2009 |
| WO | 2009/069790 A1 | 6/2009 |
| WO | 2009/136596 A1 | 11/2009 |
| WO | 2009136596 A1 | 11/2009 |
| WO | WO 2009136596 A1 * | 11/2009 |
| WO | 2010/065494 A2 | 6/2010 |
| WO | 2010/071362 A2 | 6/2010 |
| WO | 2010/075421 A2 | 7/2010 |
| WO | 2010/098246 A1 | 9/2010 |
| WO | 2010/099534 A2 | 9/2010 |
| WO | 2010098246 A1 | 9/2010 |
| WO | 2010/135403 A2 | 11/2010 |
| WO | 2011/053334 A1 | 5/2011 |
| WO | 2011053334 A1 | 5/2011 |

OTHER PUBLICATIONS

Desmarteau, "Novel Perfluorinated Ionomers and Ionenes", Journal of Fluorine Chemistry, 1995, vol. 72, pp. 203-208.

Feiring et al, "Aromatic Monomers With Pendant Fluoroalkylsulfonate and Sulfonimide Groups", Journal of Fluorine Chemistry, 2000, vol. 105, pp. 129-135.

Feiring et al, "Novel Aromatic Polymers With Pendant Lithium Perfluoroalkylsulfonate or Sulfinimide Groups", Macromolecules, 2000, vol. 33, pp. 9262-9271.

He et al, "A Hole-Transporting Material With Contollable Morphology Containing Binaphthyl and Triphenylamine Chromophores", Advanced Functional Materials, 2006, vol. 16, No. 10, pp. 1343-1348.

(56) References Cited

OTHER PUBLICATIONS

He et al, "High-Efficiency Organic Polymer Light-Emitting Heterostructure Devices on Flexible Plastic Substrates", Applied Physics Letters, 2000, vol. 76, No. 6, pp. 661-663.
Lee et al, "A Thermally Stable Hole Injection Material for Use in Organic Light-Emitting Diodes", Thin Solid Films, 2007, vol. 515, pp. 7726-7731.
Lee et al, "Poly(Thieno(3,4-B)Thiophene) A New Stable Low Band Gap Conducting Polymer", Macromolecules, 2001, vol. 34, pp. 5746-5747.
Maeda et al, "Alkynylpyrenes as Improved Pyrene-Based Biomolecular Probes With the Advantages of High Fluorescence Quantum Yields and Long Absorption/Emission Wavelengths", Chemistry—A European Journal, 2006, vol. 12(3), pp. 824-831.
March, "Aromatization of Six-Membered Rings", Advanced Organic Chemistry, Wiley-Interscience (1992), $4^{th}$ Ed., pp. 1162-1164.
Minabe et al, "Electrophilic Substitution of Monosubstituted Pyrenes", Bulletin of the Chemical Society of Japan, 1994, vol. 67(1), pp. 172-179.
Noji et al, "A New Catalytic System for Aerobic Oxidative Coupling of 2-Naphthol Derivatives by the Use of CuCl-Amine Complex: A Practical Synthesis of Binaphthol Derivatives", Tetrahedron Letters, 1994, vol. 35, No. 43, pp. 7983-7984.
Norman, et al, "The Reactions of Pyrene With Free Radicals and With Sodium", Journal of the Chemical Society, 1958, pp. 175-179.
Park et al, "AB Inition Study of Pyrenes for Blue Organic Light-Emitting Diodes", Molecular Crystals and Liquid Crystals, 2006, vol. 444, pp. 177-184.
"Color" (Definition) Web. Sep. 27, 2011, <http://hyperphysicsphy-astr.gsu/Hbase/vision/secpl>.
Appleby et al, Polymeric Perfluoro Bis-Sulfanomides As Possible Fuel Cell Electrolytes, J. Electrochem Soc. 1993, vol. 140, pp. 109-111.
Borello et al, "Photodetectors", Kirk-Othmer Encyclopedia of Chemical Technology, $4^{th}$ Edition, 1999, vol. 18, pp. 1537-1538.
Braun, et al, "Visible Light Emission From Semiconducting Polymer Diodes", Applied Physics Letters, 1991, vol. 58, (18), pp. 1982-1984.
Chen et al, "Efficient Blue Light-Emitting Diodes Using Cross-Linked Layers of Polymeric Arylamine and Fluorene", Synthetic Metals, 1999, vol. 107, pp. 129-138.
Chu et al, "Highly Efficient and Stable Inverted Bottom-Emission Organic Light-Emitting Devices", Applied Physics Letters, 2006, vol. 89, pp. 053503-1 to 3.
Wolfe et al "Rational Development of Practical Catalysts for Aromatic Carbon—Nitrogen Bond Formation", Acc. Chem. Res. 1998, 31, pp. 805-818.
Yang Etal, "Palladium-Catalyzed Amination of Aryl Halides and Sulfonates", Journal of Organometallic Chemistry, 576, 1999, pp. 125-146.
Gustafsson, "Flexible Light-Emitting Diodes Made From Soluble Conducting Polymer", Nature, vol. 357, pp. 477-479 (Jun. 11, 1992).
Kirk-Othmer Encyclopedia of Chemical Technology, Fourth Edition, vol. 18, p. 837-860, 1996 by Y. Wang.
CRC Handbook of Chemistry and Physics, $81^{st}$ Ed., (2000-2001) (Book Not Included).
Markus, John, Electronics and Nucleonics Dictionary, 470 and 476 (McGraw-Hill 1966).
Murata et al, "Palladium-Catalyzed Borylation of Aryl Halides or Triflates With Dialkoxyborane: A Novel and Facile Synthetic Route to Aryboronates", Journal of Organic Chemistry, 2000, vol. 65, No. 1, pp. 164-168.
Negishi et al, III.2.15 Palladium Catalyzed Conjugate Substitution; Handbook of Organopalladium Chemistry for Organic Synthesis, 2000, vol. 1, pp. 767-789.
Negishi, "Palladium-or Nickel-Catalyzed Cross Coupling, A New Selective Method for Carbon—Carbon Bond Formation", Accounts of Chemical Research, 1982, vol. 15, pp. 340-348.
Stille, "The Palladium-Catalyzed Cross-Coupling Reactions of Organotin Reagents With Organic Electrophiles", Angew. Chem. Int. Ed. Engl., 1986, vol. 25, pp. 508-524.
Tong et al, "Enhancement of OLED Efficiencies and High-Voltage Stabilities of Light-Emitting Materials by Deuterzation", Journal of Physical Chemistry, 2007, vol. 111, pp. 3490-3494.
Wang et al, "Novel Bis(8-Hydroxyquinoline)Phenolate-Aluminum Complexes for Organic Light-Emitting Diodes", Synthetic Metals, 2002, vol. 131, 1-3, pp. 1-5.
Weine et al, "Reactions of an O-Quinone Monoimide With Anthracenes, Phencyclone, and 1,3-Diphenylisobenzofuran", Journal of Organic Chemistry, 1989, vol. 54, pp. 5926-5930.
Wellmann et al, "HighI-Efficiency P-I-N Organic Light-Emitting Diodes With Long Lifetime", Journal of the SID, 2005, vol. 13/5, pp. 393-397.
Yamada et al, Synthesis of 2,9-Dichloro-1, 10-Phenanthroline From N,N'-Annelated Phenanthrolinediones, Bulletin of the Chemical Society of Japan, 1990, vol. 63, No. 9, pp. 2710-2712.
Yamamoto et al, "Electrically Conducting and Thermally Stable-Conjugated Poly(Arylene)s Prepared by Organometallic Process", Progress in Polymer Science, 1992, vol. 17, pp. 1153-1205.
Yan et al, "Synthesis and Nonlinear Optical Properties of Novel Multi-Branched Two-Photon Polymerization Initiators", Journal of Material Chemistry, 2004, vol. 14, pp. 2295-3000.
Zhu et al, "An Improved Preparation of Arylboronates: Application in One-Pot Suzuki Biaryl Synthesis", Journal of Organic Chemistry, 2003, vol. 68, pp. 3729-3732.
Zhu et al, "Effect of ITO Carrier Concentration on the Performance of LightI-Emitting Diodes", 2000; Material Research Society; Chem Abstract 134: 122994.
Zhao et al, "Solid-State Dye-Sensitized Photovoltaic Device With Newly Designed Small Organic Molecule As Hole-Conductor", Chemical Physical Letters, 2007, vol. 445, pp. 259-264.
Tokito et al, "Highly Efficient Blue-Green Emission From Organic Light-Emitting Diodes Using Dibenzochrysene Derivatives", Applied Physics Letters, 200, vol. 77, No. 2, pp. 160-162, Year 2000.
Hartwig, "Discovery and Understanding of Transition-Metal-Catalyzed Aromatic Substitution Reactions," Syn Lett., 2006, No. 9, pp. 1283-1294.
Hartwig, "Carbon-Heteroatom Bond Formation Catalyzed by Organometallic Complexes," Nature, 2008 vol. 455, No. 18, pp. 314-322.
Buchwald, S. L., et al.; Industrial-Scale Palladium-Catalyzed Coupling of Aryl Halides and Amines—A Personal Account; Adv. Synth. Catal, 2006, 348, 23-39.
Desarbre, Eric; Synthesis of symmetric and non-symmetric indolo[2,3-c]carbazole derivatives: preparation of indolo [2,3-c]pyrrolo[3,4-a]carbazoles; Journal of the Chemical Society, Perkin Transactions 1: Organic and Bio-Organic Chemistry, (13), pp. 2009-2016; (1998).
Knolker, Hans-Joachim; Tetrahedron Letters, Transition Metal Complexes in Organic Synthesis (1998), 39 (23), pp. 4007-4008.
S. M. Sze; Physics of Semiconductor Devices, 2nd edition, John Wiley and Sons, p. 492-493, Year 1981.
Markus e al., Electronics and Nucleonics Dictionary, pp. 470-471 & 476 (McGraw-Hill 1966), Year 1966.
Gustafsson et al., "Flexible Light-Emitting Diodes Made From Soluble Conducting Polymers," Nature, 1992, vol. 357, pp. 477-479.
Wang, "Photoconductive Materials," Kirk-Othmer Encyclopedia of Chemical Technology, Fourth Edition, 1996, vol. 18, pp. 837-860.
Janosik, T.; Reactions of 2,3'biindolyl; Synthesis of Indolo[3,2-a]carbazoles; Tetrahedron (1999), 55, pp. 2371-2380.
Robertson, N.; Preparation XRay Structure, Journal of Materials Chemistry (2000), 10, pp. 2043-2047.
Pindur, U.; Müller, J. Arch. Pharm. (1987), 320, pp. 280-282 (Not English).
International Search Report, European Patent Office, Rijswijk in PCT/2011/065883, PCT Counterpart of the Present U.S. Appl. No. 13/990,832, Saltuk Saldami, Authorized Officer, Feb. 4, 2012.
Beckmann et al, "Methyl Reorientation in Solid 3-Ethychrysene and 3-Isopropylesene; Solid State Nuclear Magnetic Resonance" 1998; vol. 12, pp. 251-256.
Carey et al., Structure and Mechanisms; Advanced Organic Chemistry, Part A, $5^{th}$ Ed., pp. 142-145, Year 2007.

(56) References Cited

OTHER PUBLICATIONS

Chu et al., "Comparitive Study of Single and Multiemissive Layers in Inverted White Organic Light-Emitting Devices", Applied Physics Letters, 2006, vol. 89, No. 11, p. 113502.

Danel et al., "Blue-Emitting Anthracenes With End-Capping Diarylamines", Chem. Mater., 2002, vol. 14, pp. 3860-3865.

Eaton et al, "Dihedral Angle of Biphenyl in Solution and the Molecular Force Field", J. Chem. Soc. Faraday Trans. 2, 1973, 60 pp. 1601-1608.

Hartwig, "Carbon-Heteroatom Bond Formation Catalyzed by Organometallic Complexes", Nature, 2008, vol. 455, No. 18, pp. 314-322.

Hartwig, "Discovery and Understanding of Transition-Metal-Catalyzed Aromatic Subbstitution Reactions", Syn. Letters, 2006, No. 9, pp. 1283-1294.

Ishiyama et al, "Palladium(0)-Catalyzed Cross-Couplin Reaction of Alkoxydiboron With Haloarenes: A Direct Procedure for Arylboronic Esters", Journal of Organic Chemistry, 1995, vol. 60, pp. 7508-7510.

Kim et al, "Synthesis and Electroluminescent Properties of Highly Efficient Anthracene Derivatives With Bulky Side Groups", Organic Electronics, 2009, vol. 10, No. 5, pp. 822-833.

Klaerner et al, "Cross-Linkable Polymers Based on Dialkylfluorenes", Chemistry of Materials, 1999, 11, pp. 1800-1805.

Kodomari et al, "Selective Halogenation of Aromatic Hydrocarbons", Journal of Organic Chemistry, 1988, vol. 53, p. 2093.

Kumada, "Nickel and Palladium Complex Catalyzed Cross-Coupling Reactions of Organometallic Reagents With Organic Halides", Pure & Applied Chemistry, 1980, vol. 52, pp. 669-679.

Leznoff et al, "Photocyclization of Aryl Polyenes. v. Photochemical Synthesis of Substituted Chrysenes", Canadian Journal of Chemistry, 1972, vol. 50, pp. 528-533.

Mueller et al, "Synthesis and Characterization of Soluble Oligo(9, 10-Anthrylene)s," Chemische Berichte, 1994, 127, pp. 437-444.

Murata et al, "Novel Palladium(0)-Catalyzed Coupling Reaction of Dialkoxyborane With Aryl Halides: A Convenient Synthetic Route to Arylboronates", Journal of Organic Chemistry, 1997, vol. 62, pp. 6458-6459.

* cited by examiner

COMPOSITIONS FOR ELECTRONIC APPLICATIONS

RELATED APPLICATION DATA

This application claims priority under 35 U.S.C. §119(e) from U.S. Provisional Application No. 61/424,955 filed on Dec. 20, 2010, which is incorporated by reference herein in its entirety.

BACKGROUND

1. Field of the Disclosure

This invention relates to compositions including indolocarbazole derivative compounds which are useful in electronic devices. It also relates to electronic devices in which at least one layer includes such a compound.

2. Description of the Related Art

Organic electronic devices that emit light, such as light-emitting diodes that make up displays, are present in many different kinds of electronic equipment. In all such devices, an organic electroactive layer is sandwiched between two electrical contact layers. At least one of the electrical contact layers is light-transmitting so that light can pass through the electrical contact layer. The organic electroactive layer emits light through the light-transmitting electrical contact layer upon application of electricity across the electrical contact layers.

It is well known to use organic electroluminescent compounds as the electroactive component in light-emitting diodes. Simple organic molecules such as anthracene, thiadiazole derivatives, and coumarin derivatives are known to show electroluminescence. Semiconductive conjugated polymers have also been used as electroluminescent components, as has been disclosed in, for example, U.S. Pat. Nos. 5,247,190, 5,408,109, and Published European Patent Application 443 861. In many cases the electroluminescent compound is present as a dopant in a host material.

There is a continuing need for new materials for electronic devices.

SUMMARY

There is provided a composition comprising (a) a dopant capable of electroluminescence having an emission maximum between 380 and 750 nm, (b) a first host compound having at least one unit of Formula I

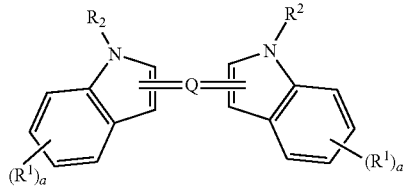

Formula I wherein:

Q is a fused ring linkage having the formula

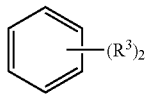

$R^1$ is the same or different at each occurrence and is D, alkyl, aryl, silyl, alkoxy, aryloxy, cyano, styryl, vinyl, or allyl;

$R^2$ is the same or different at each occurrence and is H, D, alkyl, hydrocarbon aryl, or styryl, or both $R^2$ are an N-heterocycle;

$R^3$ is the same or different at each occurrence and is alkyl, aryl, silyl, alkoxy, aryloxy, cyano, styryl, vinyl, or allyl; and a is the same or different at each occurrence and is an integer from 0-4; and (c) a second host compound.

There is also provided an electronic device comprising an electroactive layer comprising the above composition.

There is also provided a thin film transistor comprising an organic semiconductor layer comprising a compound having at least one unit of Formula I.

BRIEF DESCRIPTION OF THE DRAWINGS

Embodiments are illustrated in the accompanying figures to improve understanding of concepts as presented herein.

Figure 1A:
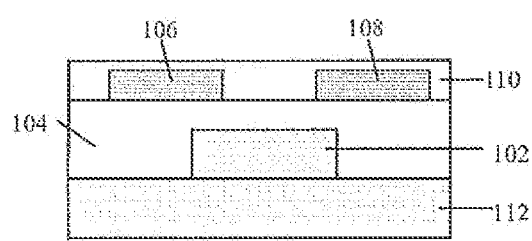
FIG. 1A includes a schematic diagram of an organic field effect transistor (OTFT) showing the relative positions of the electroactive layers of such a device in bottom contact mode.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are disclosed herein and are exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Composition, the Electronic Device, and finally Examples.

1. Definitions and Clarification of Terms

Before addressing details of embodiments described below, some terms are defined or clarified.

As used herein, the term "aliphatic ring" is intended to mean a cyclic group that does not have delocalized pi electrons. In some embodiments, the aliphatic ring has no unsaturation. In some embodiments, the ring has one double or triple bond.

The term "alkoxy" refers to the group RO—, where R is an alkyl. The term "alkyl" is intended to mean a group derived from an aliphatic hydrocarbon having one point of attachment, and includes a linear, a branched, or a cyclic group. The term is intended to include heteroalkyls. The term "hydrocarbon alkyl" refers to an alkyl group having no heteroatoms. The term "deuterated alkyl" is a hydrocarbon alkyl having at least one available H replaced by D. In some embodiments, an alkyl group has from 1-20 carbon atoms.

The term "aryl" is intended to mean a group derived from an aromatic hydrocarbon having one point of attachment. The term "aromatic compound" is intended to mean an organic compound comprising at least one unsaturated cyclic group having delocalized pi electrons. The term is intended to include heteroaryls. The term "hydrocarbon aryl" is intended to mean aromatic compounds having no heteroatoms in the ring. The term aryl includes groups which have a single ring and those which have multiple rings which can be joined by a single bond or fused together. The term "deuterated aryl" refers to an aryl group having at least one available H bonded directly to the aryl replaced by D. The term "arylene" is intended to mean a group derived from an aromatic hydrocarbon having two points of attachment. In some embodiments, an aryl group has from 3-60 carbon atoms.

The term "aryloxy" refers to the group RO—, where R is an aryl. The term "compound" is intended to mean an electrically uncharged substance made up of molecules that further consist of atoms, wherein the atoms cannot be separated by physical means. The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

The term "deuterated" is intended to mean that at least one H has been replaced by D. The deuterium is present in at least 100 times the natural abundance level. A "deuterated analog" of compound X has the same structure as compound X, but with at least one D replacing an H.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "electroactive" when referring to a layer or material, is intended to mean a layer or material that exhibits electronic or electro-radiative properties. In an electronic device, an electroactive material electronically facilitates the operation of the device. Examples of electroactive materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The prefix "hetero" indicates that one or more carbon atoms have been replaced with a different atom. In some embodiments, the different atom is N, O, or S.

The term "host material" is intended to mean a material to which a dopant is added. The host material may or may not have electronic characteristic(s) or the ability to emit, receive, or filter radiation. In some embodiments, the host material is present in higher concentration.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "luminescence" refers to light emission that cannot be attributed merely to the temperature of the emitting body, but results from such causes as chemical reactions, electron bombardment, electromagnetic radiation, and electric fields. The term "luminescent" refers to a material capable of luminescence.

The term "N-heterocycle" refers to a heteroaromatic compound or group having at least one nitrogen in an aromatic ring.

The term "O-heterocycle" refers to a heteroaromatic compound or group having at least one oxygen in an aromatic ring.

The term "N,O,S-heterocycle" refers to a heteroaromatic compound or group having at least one heteroatom in an aromatic ring, where the heteroatom is N, O, or S. The N,O,S-heterocycle may have more than one type of heteroatom.

The term "organic electronic device" or sometimes just "electronic device" is intended to mean a device including one or more organic semiconductor layers or materials.

The term "organometallic" refers to a material in which there is a carbon-metal bond.

The term "photoactive" refers to a material that emits light when activated by an applied voltage (such as in a light emitting diode or chemical cell) or responds to radiant energy and generates a signal with or without an applied bias voltage (such as in a photodetector or a photovoltaic cell).

The term "S-heterocycle" refers to a heteroaromatic compound or group having at least one sulfur in an aromatic ring.

The term "siloxane" refers to the group $(RO)_3Si$—, where R is H, D C1-20 alkyl, or fluoroalkyl.

The term "silyl" refers to the group $R_3Si$—, where R is H, D, C1-20 alkyl, fluoroalkyl, or aryl. In some embodiments, one or more carbons in an R alkyl group are replaced with Si.

All groups can be substituted or unsubstituted unless otherwise indicated. In some embodiments, the substituents are selected from the group consisting of D, halide, alkyl, alkoxy, aryl, aryloxy, cyano, silyl, siloxane, and $NR_2$, where R is alkyl or aryl.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The IUPAC numbering system is used throughout, where the groups from the Periodic Table are numbered from left to right as 1-18 (CRC Handbook of Chemistry and Physics, 81$^{st}$ Edition, 2000). In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

The terms "compound having at least one unit of Formula I", "host compound having at least one unit of Formula I" and "electroactive compound having at least one unit of Formula I" as used herein, all refer to the same material.

2. Composition

The composition comprises (a) a dopant capable of electroluminescence having an emission maximum between 380 and 750 nm, (b) a host compound having at least one unit of Formula I

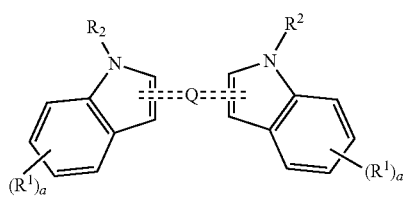

Formula I wherein:

Q is a fused ring linkage having the formula

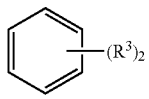

$R^1$ is the same or different at each occurrence and is D, alkyl, aryl, silyl, alkoxy, aryloxy, cyano, styryl, vinyl, or allyl;

$R^2$ is the same or different at each occurrence and is H, D, alkyl, hydrocarbon aryl, or styryl, or both $R^2$ are an N-heterocycle;

$R^3$ is the same or different at each occurrence and is alkyl, aryl, silyl, alkoxy, aryloxy, cyano, styryl, vinyl, or allyl;

a is the same or different at each occurrence and is an integer from 0-4; and (c) a second host compound.

By "having at least one unit" it is meant that the host can be a compound having Formula I, an oligomer or homopolymer having two or more units of Formula I, or a copolymer, having units of Formula I and units of one or more additional monomers. The units of the oligamers, homopolymers, and copolymers can be linked through substituent groups.

The term "fused ring linkage" is used to indicate that the Q group is fused to both nitrogen-containing rings, in any orientation.

The compounds having at least one unit of Formula I can be used as a cohost for dopants with any color of emission. In some embodiments, the compounds having at least one unit of Formula are used as cohosts for organometallic electroluminescent materials.

In some embodiments, the composition consists essentially of (a) a dopant capable of electroluminescence having an emission maximum between 380 and 750 nm, (b) a host compound having at least one unit of Formula I, and (c) a second host compound.

The amount of dopant present in the composition is generally in the range of 3-20% by weight, based on the total weight of the composition; in some embodiments, 5-15% by weight. The ratio of first host having at least one unit of Formula I to second host is generally in the range of 1:20 to 20:1; in some embodiments, 5:15 to 15:5. In some embodiments, the first host material having at least one unit of Formula I is at least 50% by weight of the total host material; in some embodiments, at least 70% by weight.

(a) Dopant

Electroluminescent ("EL") materials which can be used as a dopant in the photoactive layer, include, but are not limited to, small molecule organic luminescent compounds, luminescent metal complexes, conjugated polymers, and mixtures thereof. Examples of small molecule luminescent organic compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds and cyclometallated complexes of metals such as iridium and platinum. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Examples of red light-emitting materials include, but are not limited to, complexes of Ir having phenylquinoline or phenylisoquinoline ligands, periflanthenes, fluoranthenes, and perylenes. Red light-emitting materials have been disclosed in, for example, U.S. Pat. No. 6,875,524, and published US application 2005-0158577.

Examples of green light-emitting materials include, but are not limited to, complexes of Ir having phenylpyridine ligands, bis(diarylamino)anthracenes, and polyphenylenevinylene polymers. Green light-emitting materials have been disclosed in, for example, published PCT application WO 2007/021117.

Examples of blue light-emitting materials include, but are not limited to, complexes of Ir having phenylpyridine or phenylimidazole ligands, diarylanthracenes, diaminochrysenes, diaminopyrenes, and polyfluorene polymers. Blue light-emitting materials have been disclosed in, for example, U.S. Pat. No. 6,875,524, and published US applications 2007-0292713 and 2007-0063638.

In some embodiments, the dopant is an organometallic complex. In some embodiments, the organometallic complex is cyclometallated. By "cyclometallated" it is meant that the complex contains at least one ligand which bonds to the metal in at least two points, forming at least one 5- or 6-membered ring with at least one carbon-metal bond. In some embodiments, the metal is iridium or platinum. In some embodiments, the organometallic complex is electrically neutral and is a tris-cyclometallated complex of iridium having the formula $IrL_3$ or a bis-cyclometallated complex of iridium having the formula $IrL_2Y$. In some embodiments, L is a monoanionic bidentate cyclometalating ligand coordinated through a carbon atom and a nitrogen atom. In some embodiments, L is an aryl N-heterocycle, where the aryl is phenyl or napthyl, and the N-heterocycle is pyridine, quinoline, isoquinoline, diazine, pyrrole, pyrazole or imidazole. In some embodiments, Y is a monoanionic bidentate ligand. In some embodiments, L is a phenylpyridine, a phenylquinoline, or a phenylisoquinoline. In some embodiments, Y is a β-dienolate, a diketimine, a picolinate, or an N-alkoxypyrazole. The ligands may be unsubstituted or substituted with F, D, alkyl, perfluororalkyl, alkoxyl, alkylamino, arylamino, CN, silyl, fluoroalkoxyl or aryl groups. In some embodiments, the dopant is a cyclometalated complex of iridium or platinum. Such materials have been disclosed in, for example, U.S. Pat. No. 6,670,645 and Published PCT Applications WO 03/063555, WO 2004/016710, and WO 03/040257.

In some embodiments, the dopant is a complex having the formula $Ir(L1)_a(L2)_b(L3)_c$; where L1 is a monoanionic bidentate cyclometalating ligand coordinated through carbon and nitrogen;

L2 is a monoanionic bidentate ligand which is not coordinated through a carbon;

L3 is a monodentate ligand;

a is 1-3;

b and c are independently 0-2; and a, b, and c are selected such that the iridium is hexacoordinate and the complex is electrically neutral.

Some examples of formulae include, but are not limited to, $Ir(L1)_3$; $Ir(L1)_2(L2)$; and $Ir(L1)_2(L3)(L3')$, where L3 is anionic and L3' is nonionic.

Examples of L1 ligands include, but are not limited to phenylpyridines, phenylquinolines, phenylpyrimidines, phenylpyrazoles, thienylpyridines, thienylquinolines, and thienylpyrimidines. As used herein, the term "quinolines" includes "isoquinolines" unless otherwise specified. The fluorinated derivatives can have one or more fluorine substituents. In some embodiments, there are 1-3 fluorine substituents on the non-nitrogen ring of the ligand.

Monoanionic bidentate ligands, L2, are well known in the art of metal coordination chemistry. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include p-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

Monodentate ligand L3 can be anionic or nonionic. Anionic ligands include, but are not limited to, H⁻ ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, and the like. In some cases, ligands listed above as L2, such as β-enolates and phosphinoakoxides, can act as monodentate ligands. The monodentate ligand can also be a coordinating anion such as halide, cyanide, isocyanide, nitrate, sulfate, hexahaloantimonate, and the like. These ligands are generally available commercially.

The monodentate L3 ligand can also be a non-ionic ligand, such as CO or a monodentate phosphine ligand.

In some embodiments, one or more of the ligands has at least one substituent selected from the group consisting of F and fluorinated alkyls.

The iridium complex dopants can be made using standard synthetic techniques as described in, for example, U.S. Pat. No. 6,670,645.

Examples of organometallic iridium complexes having red emission color include, but are not limited to compounds D1 through D10 below

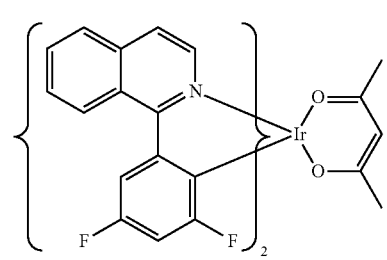

D1

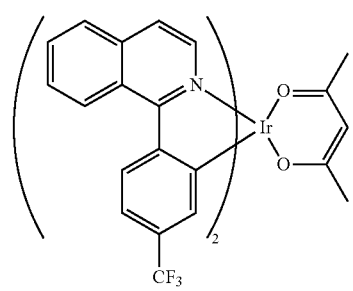

D2

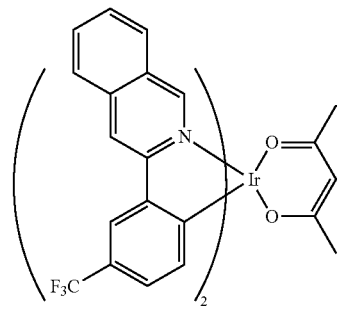

D3

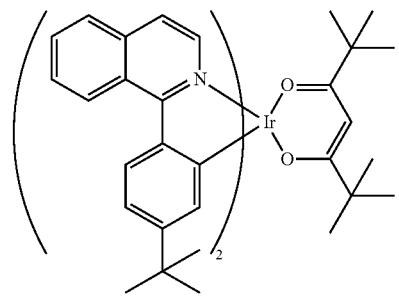

D4

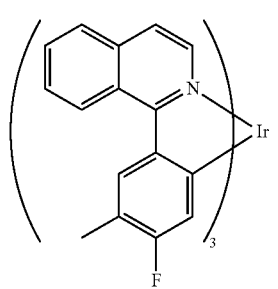
D5
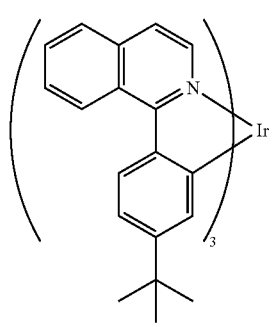
D6
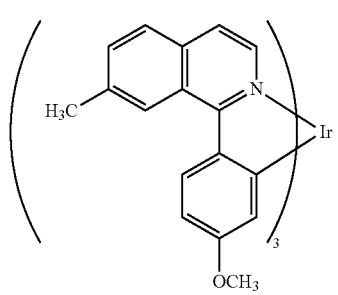
D7
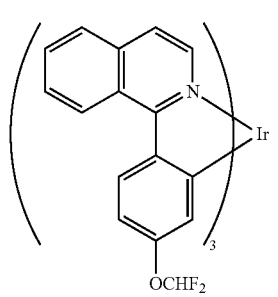
D8
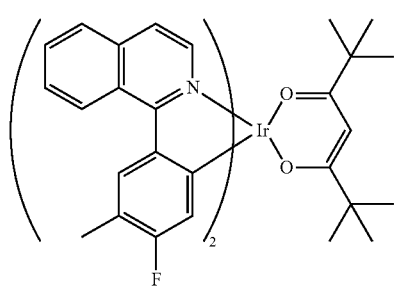
D9
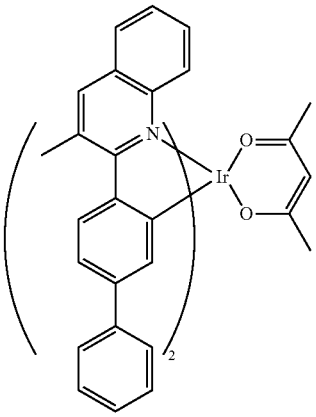
D10
Examples of organometallic Ir complexes with green emission color include, but are not limited to, D11 through D33 below.
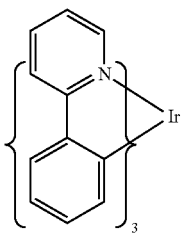
D11
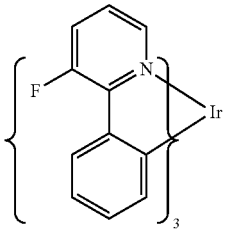
D12
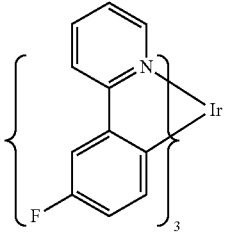
D13
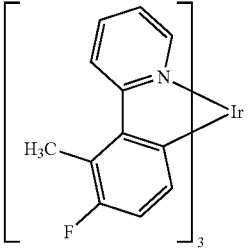
D14

-continued
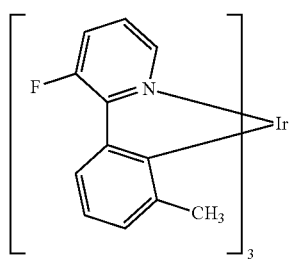
D15
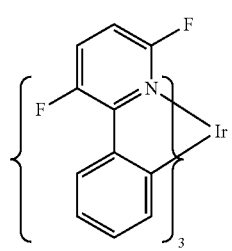
D16
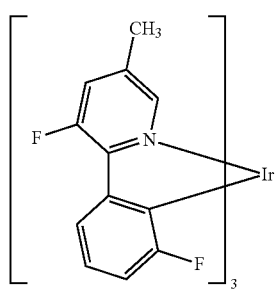
D17
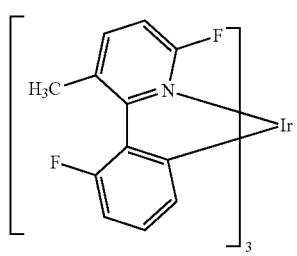
D18
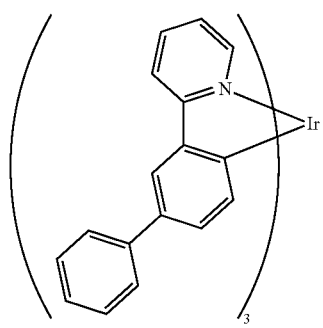
D19
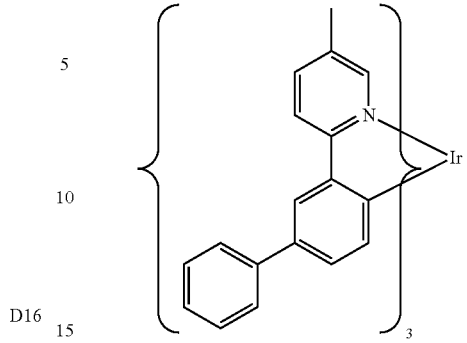
D20
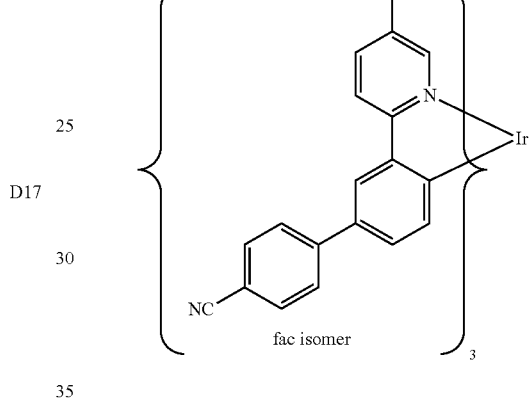
D21
fac isomer
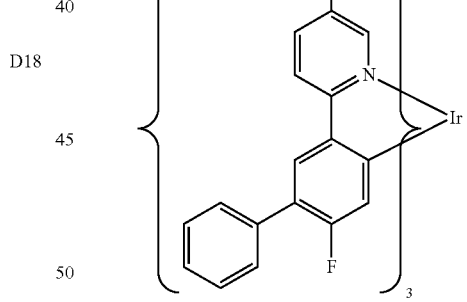
D22
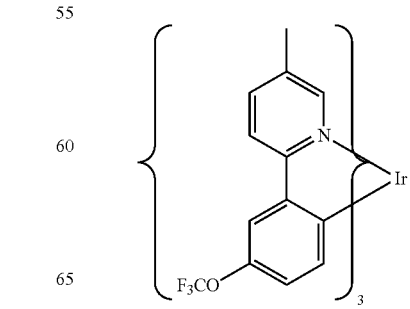
D23

D24
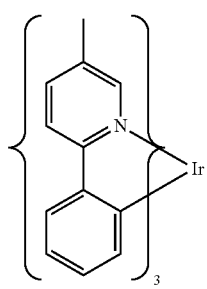
D25
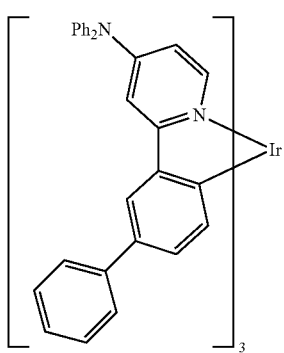
D26
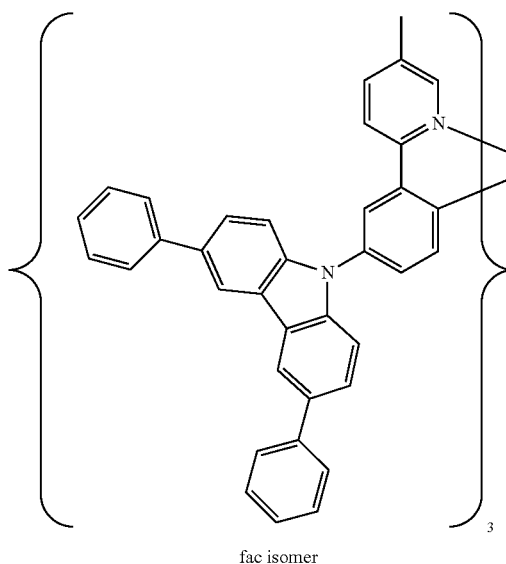
fac isomer
D27
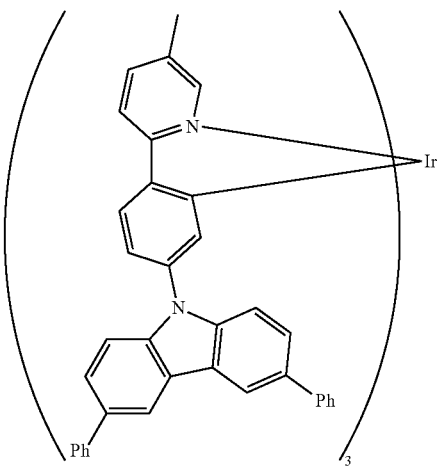
D28
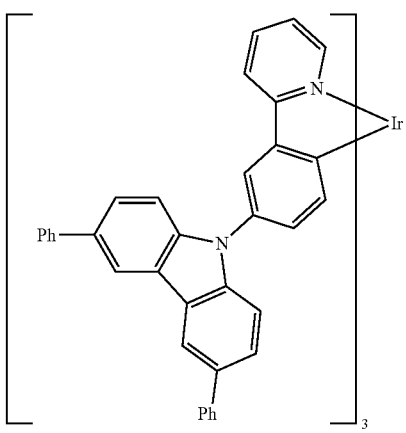
D29
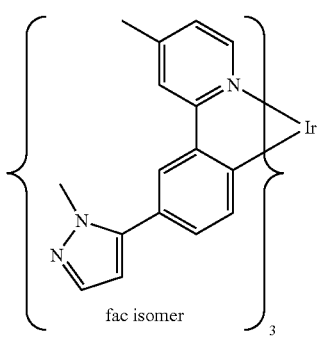
fac isomer
D30
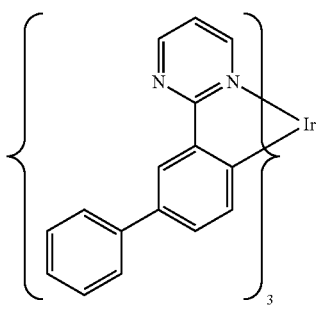

D31
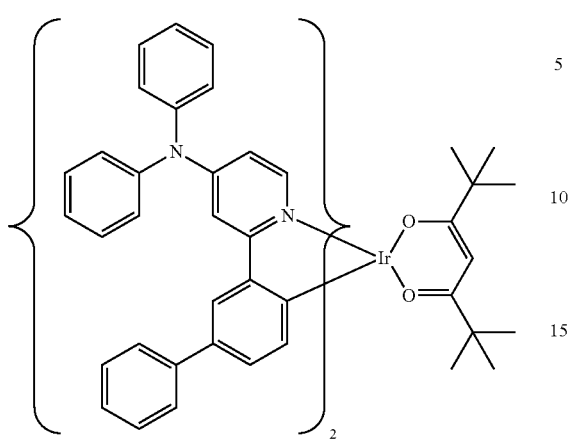
D32
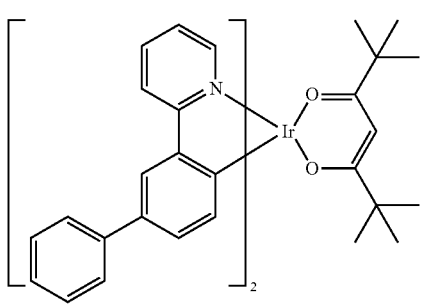
D33
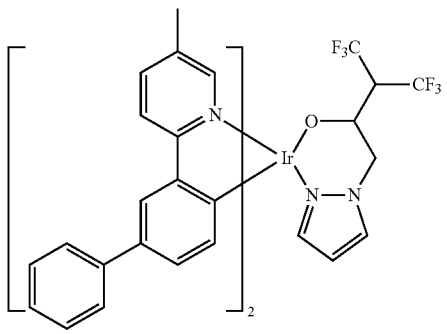
Examples of organometallic Ir complexes with blue emission color include, but are not limited to, D34 through D51 below.
D34
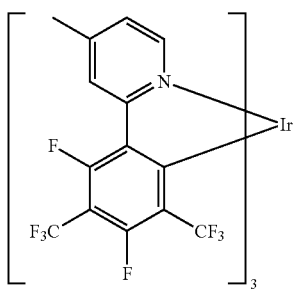
D35
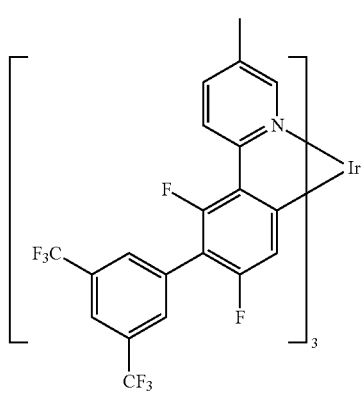
D36
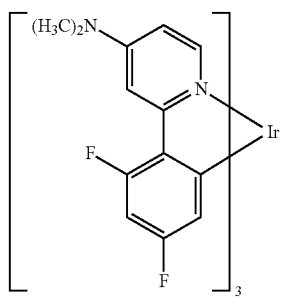
D37
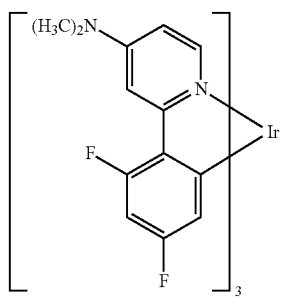
D38
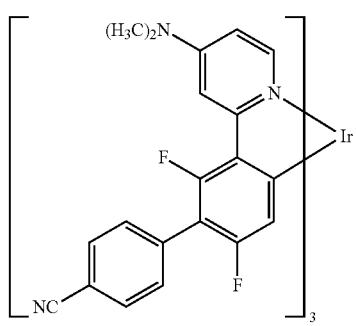

D39 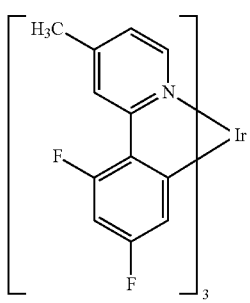
D40 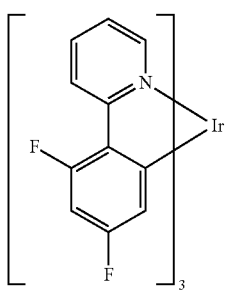
D41 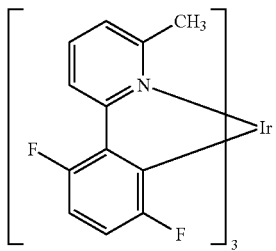
D42 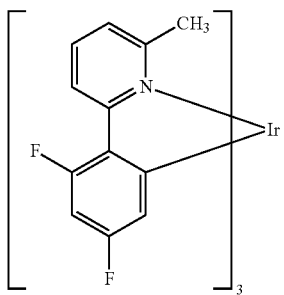
D43 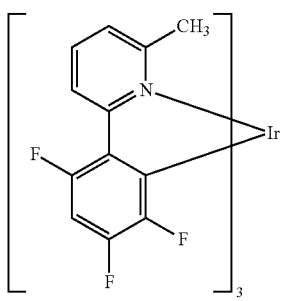
D44 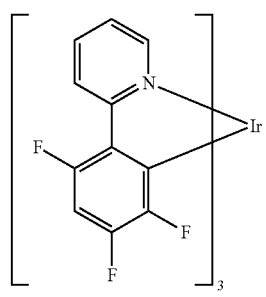
D45 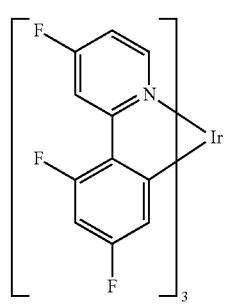
D46 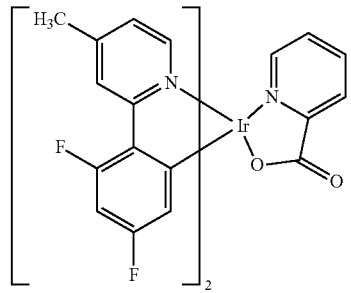
D47 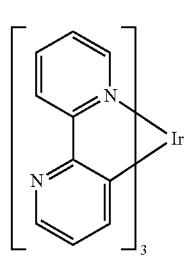
D48 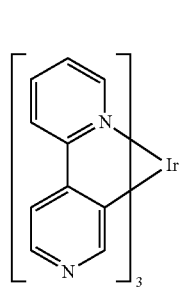

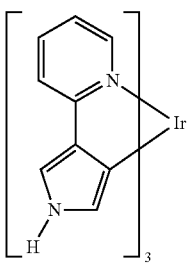

D49

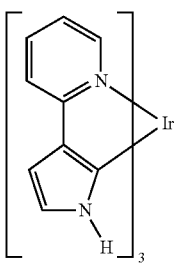

D50

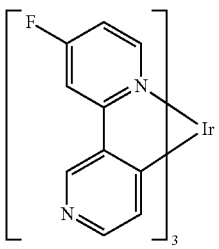

D51

In some embodiments, the dopant is a small organic luminescent compound. In some embodiments, the dopant is selected from the group consisting of a non-polymeric spiro-bifluorene compound and a fluoranthene compound.

In some embodiments, the dopant is a compound having aryl amine groups. In some embodiments, the dopant is selected from the formulae below:

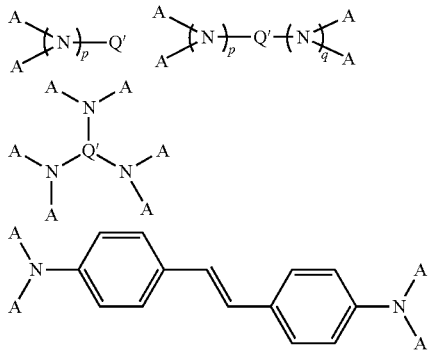

where:

A is the same or different at each occurrence and is an aromatic group having from 3-60 carbon atoms;

Q' is a single bond or an aromatic group having from 3-60 carbon atoms;

p and q are independently an integer from 1-6.

In some embodiments of the above formula, at least one of A and Q' in each formula has at least three condensed rings. In some embodiments, p and q are equal to 1.

In some embodiments, Q' is a styryl or styrylphenyl group.

In some embodiments, Q' is an aromatic group having at least two condensed rings. In some embodiments, Q' is selected from the group consisting of naphthalene, anthracene, chrysene, pyrene, tetracene, xanthene, perylene, coumarin, rhodamine, quinacridone, and rubrene.

In some embodiments, A is selected from the group consisting of phenyl, biphenyl, tolyl, naphthyl, naphthylphenyl, and anthracenyl groups.

In some embodiments, the dopant has the formula below:

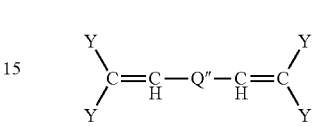

where:

Y is the same or different at each occurrence and is an aromatic group having 3-60 carbon atoms;

Q" is an aromatic group, a divalent triphenylamine residue group, or a single bond.

In some embodiments, the dopant is an aryl acene. In some embodiments, the dopant is a non-symmetrical aryl acene.

Some examples of small molecule organic green dopants include, but are not limited to, compounds D52 through D59 shown below.

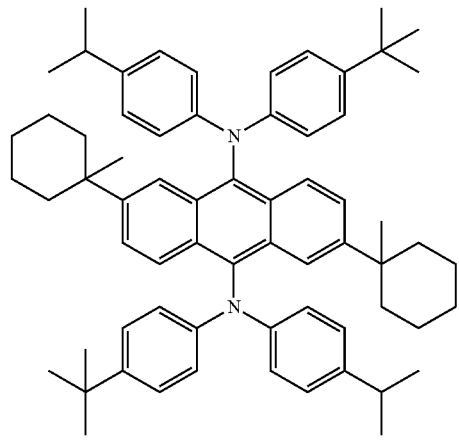

D52

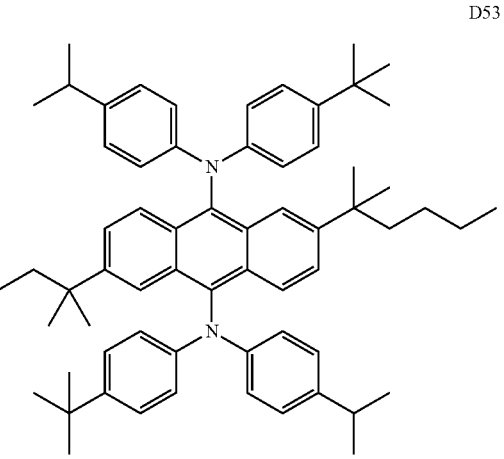

D53

-continued
D54
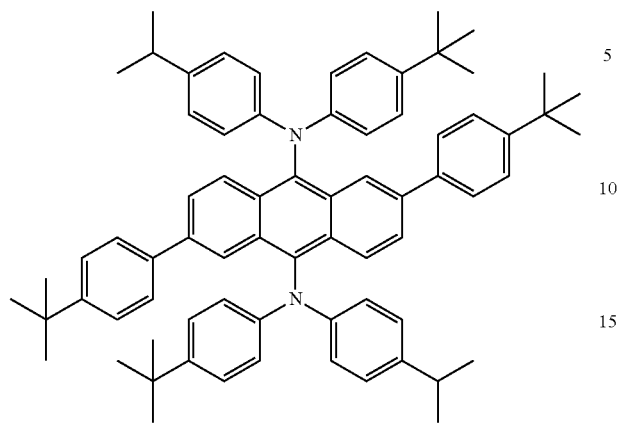
D55
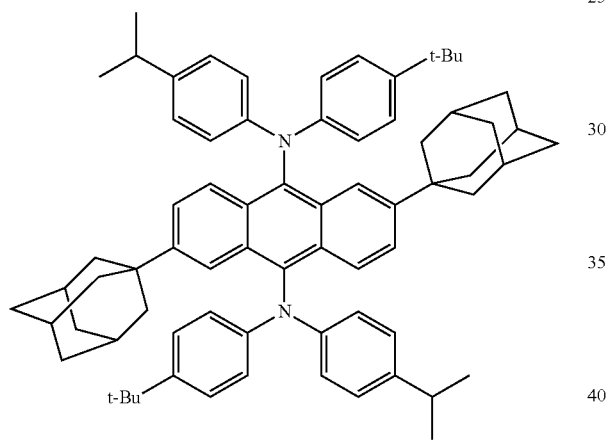
D56
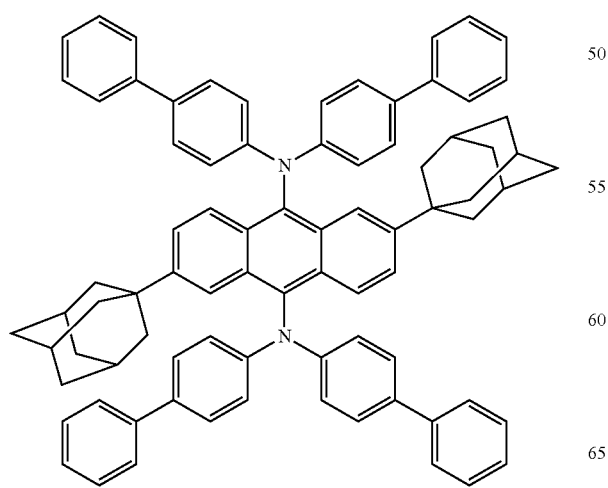
-continued
D57
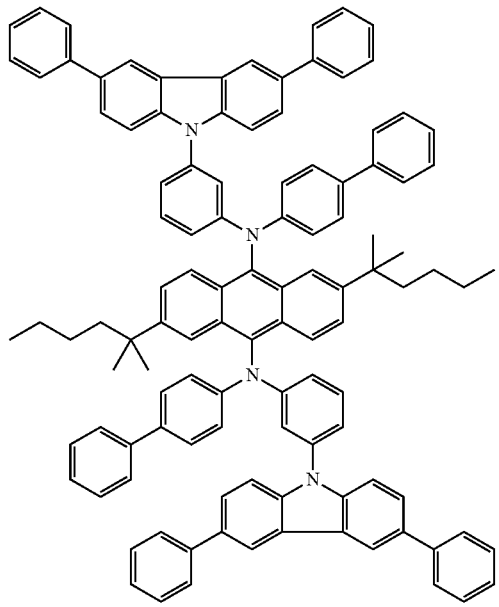
D58
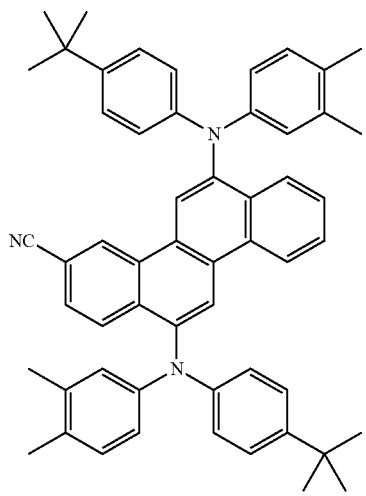
D69
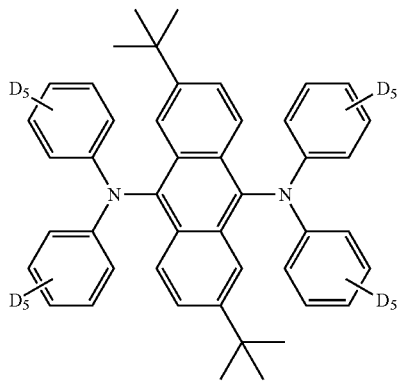

Examples of small molecule organic blue dopants include, but are not limited to compounds D60 through D67 shown below.
D60
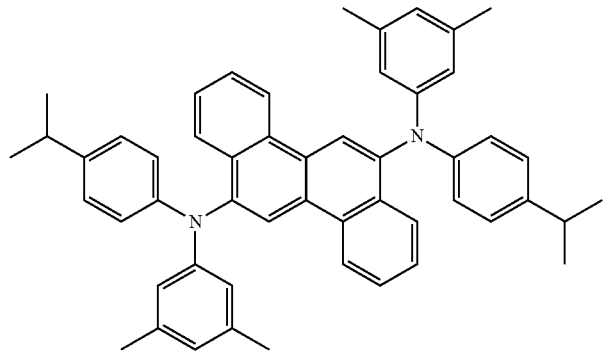
D61
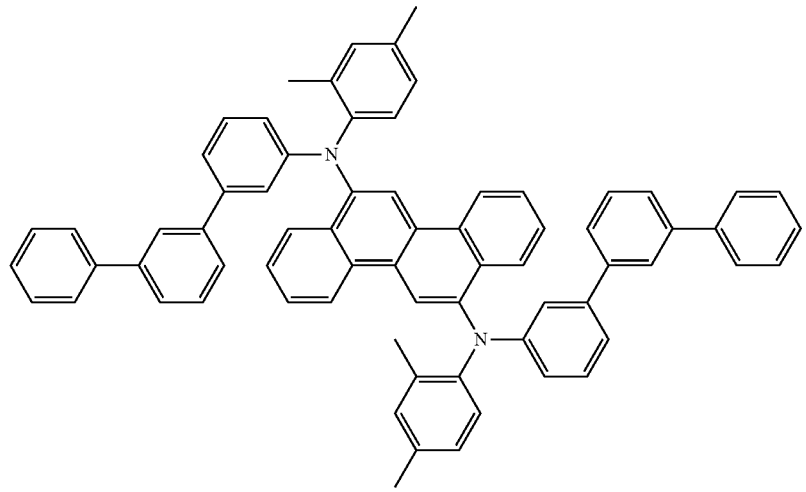
D62
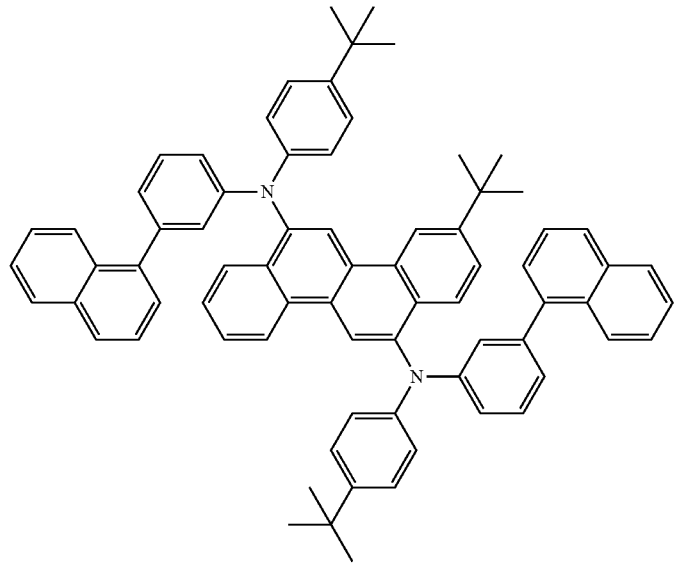

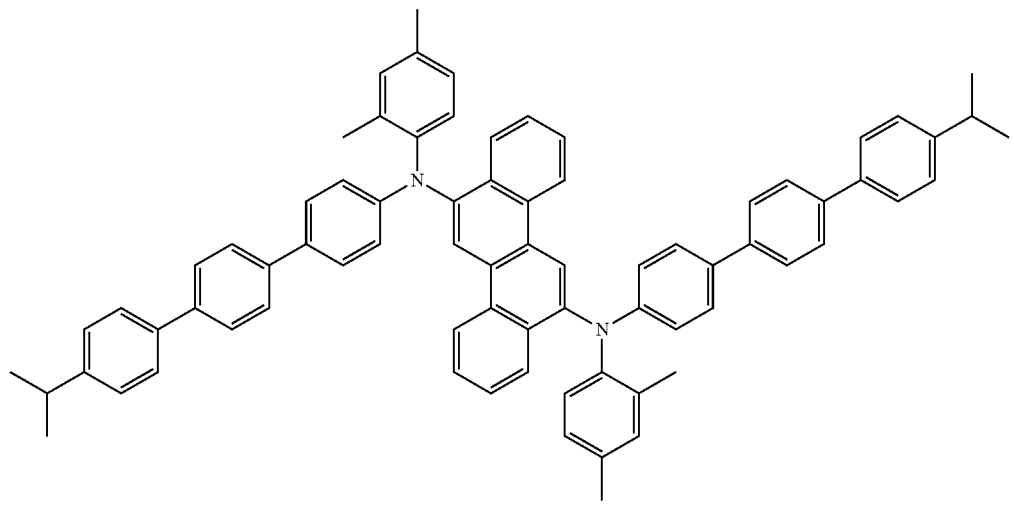
D63
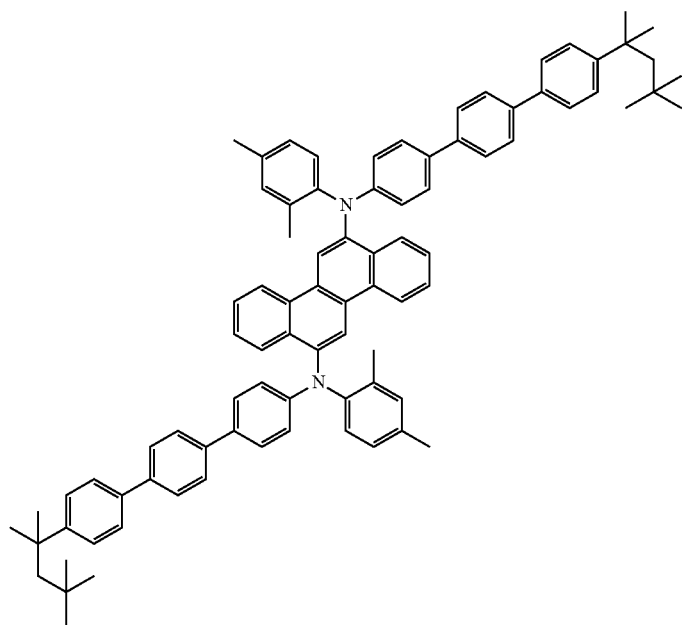
D64
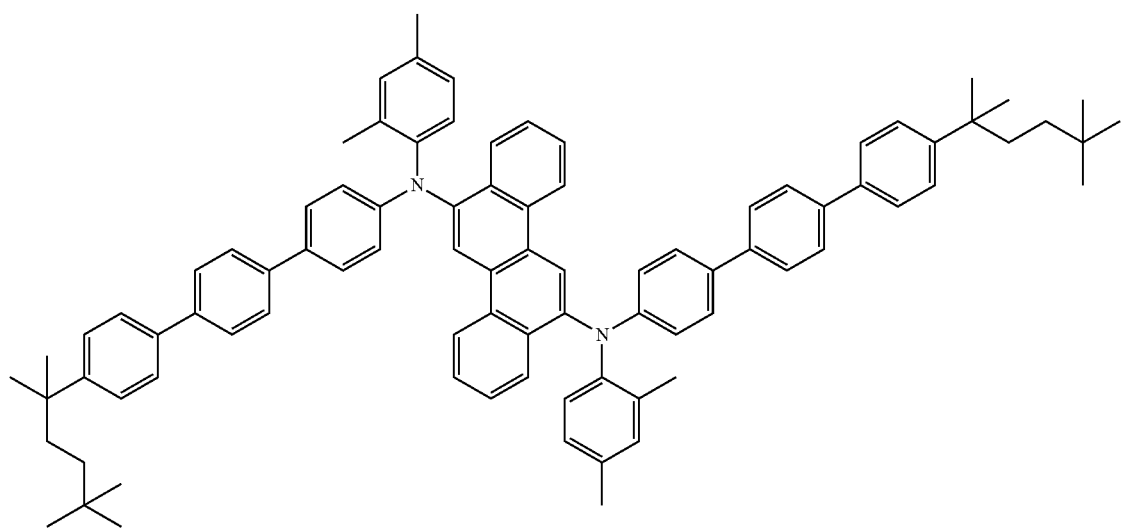
D65

D66

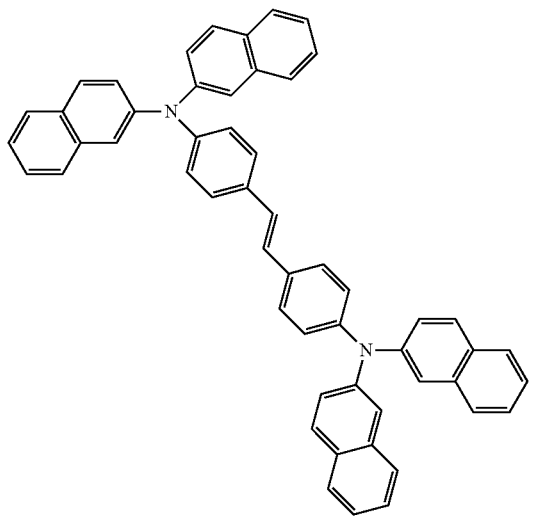

D67

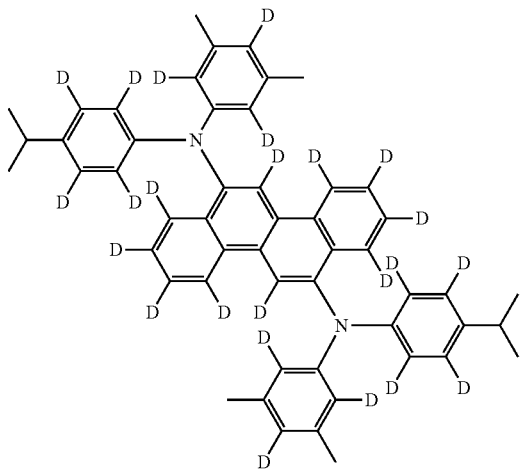

In some embodiments, the dopant is selected from the group consisting of amino-substituted chrysenes and amino-substituted anthracenes.

(b) First Host

The first host has at least one unit of Formula I as given above.

In some embodiments, the compound is at least 10% deuterated. By this is meant that at least 10% of the H are replaced by D. In some embodiments, the compound is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the compounds are 100% deuterated.

In some embodiments, deuterium is present on the indolocarhazole core, an aryl ring, a substituent group on an aryl ring, or combinations thereof.

The first host compound having at least one unit of Formula I can have any of the five core structures (a) through (e) below, where the substituents $R^1$ to $R^3$ are not shown:

core (a)

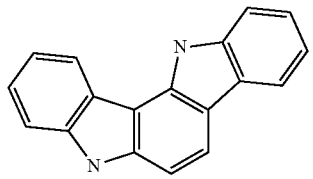

core (b)

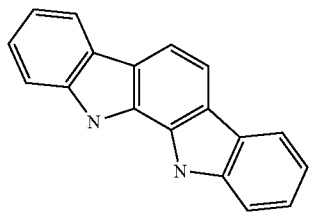

core (c)

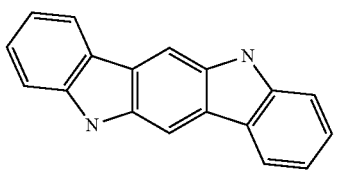

core (d)

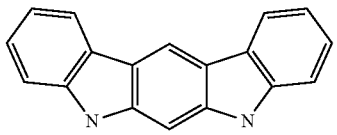

core (e)

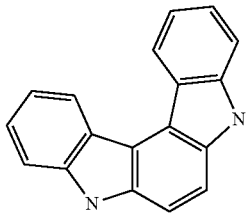

In some embodiments of Formula I, $R^2$ is aryl. In some embodiments, $R^2$ is phenyl, substituted phenyl, naphthyl, substituted naphthyl, or a deuterated analog thereof. In some embodiments, the substituent is alkyl, aryl, silyl, alkoxy, aryloxy, cyano, vinyl, or allyl. In some embodiments, $R^2$ is styryl.

In some embodiments of Formula I, both $R^2$ are an N,O,S-heterocycle. In some embodiments, the N,O,S-heterocycle is pyridine, pyrimidine, triazine, dibenzopyran, dibenzothiophene, or a deuterated analog thereof. In some embodiments, the N,O,S-heterocycle has one or more alkyl or deuterated alkyl substituents.

In some embodiments, the first host compound has at least one unit of Formula II

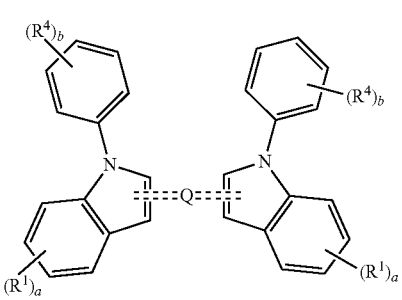

Formula II where
R¹, Q, and a are as defined for Formula I,
R⁴ is the same or different at each occurrence and is D, aryl, silyl, alkoxy, aryloxy, cyano, vinyl, allyl, dialkylamine, diarylamine, carbazole, or a deuterated analog thereof; and
b is the same or different at each occurrence and is an integer from 0-5.

In some embodiments, the first host compound has at least one unit of Formula II(a)

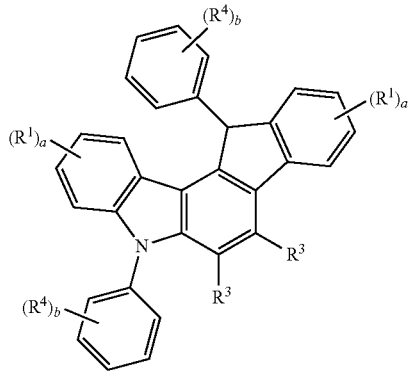

Formula II(a)

where $R^1$, $R^3$ and $R^4$, a and b are as defined above.

In some embodiments, the first host compound has at least one unit of Formula II(b)

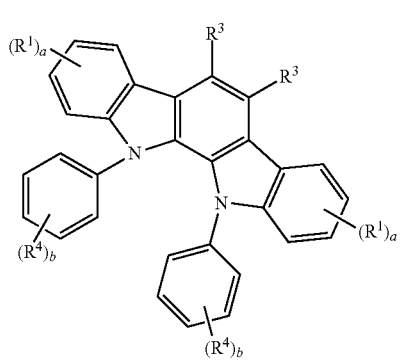

Formula II(b)

where $R^1$, $R^3$ and $R^4$, a, and b are as defined above.

In some embodiments, the first host compound has at least one unit of Formula II(c)

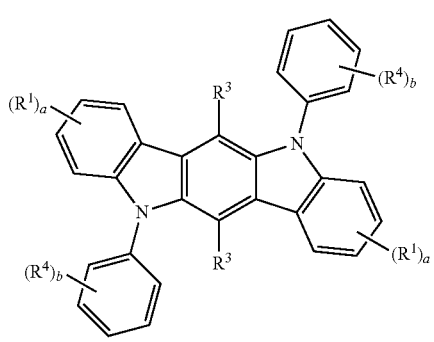

Formula II(c)

where $R^1$, $R^3$ and $R^4$, a, and b are as defined above.

In some embodiments, the first host compound has at least one unit of Formula II(d)

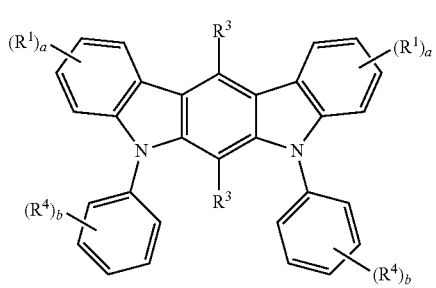

Formula II(d)

where $R^1$, $R^3$ and $R^4$, a, and b are as defined above.

In some embodiments, the first host compound has at least one unit of Formula II(e)

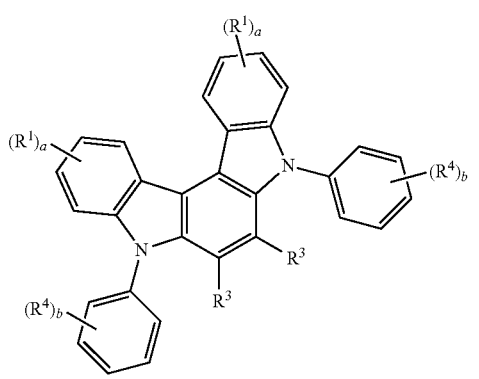

Formula II(e)

where $R^1$, $R^3$ and $R^4$, a, and b are as defined above,

In some embodiments, the compound has at least one unit of Formula II(a), Formula II(b), or Formula II(c).

In some embodiments of Formulae I, II, and II(a) through II(f), R¹ is hydrocarbon aryl, an N,O,S-heterocycle, or a deuterated analog thereof. In some embodiments, R¹ is an N-heterocycle which is pyridine, pyrimidine, triazine, pyrrole, or a deuterated analog thereof. In some embodiments, R¹ is an O-heterocycle which is dibenzopyran, dibenzofuran, or a deuterated analog thereof. In some embodiments, $R^1$ is an S-heterocycle which is dibenzothiophene. In some embodiments, $R^1$ is D, naphthyl, substituted naphthyl, styryl, pyridine, pyrimidine, triazine, a deuterated analog thereof, or a substituent of Formula III

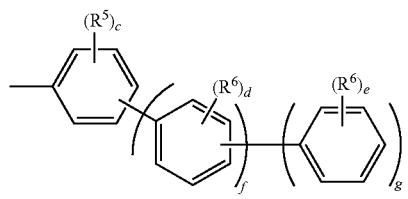

Formula III wherein:
- $R^5$ is the same or different at each occurrence and is D, aryl, silyl, alkoxy, aryloxy, cyano, vinyl, allyl, dialkylamine, diarylamine, carbazole, or a deuterated analog thereof, or adjacent $R^5$ groups can join together to form a 6-membered fused ring;
- $R^6$ is the same or different at each occurrence and is D, aryl, silyl, alkoxy, aryloxy, cyano, vinyl, allyl, dialkylamine, diarylamine, carbazole, or a deuterated analog thereof, or adjacent $R^6$ groups can join together to form a 6-membered fused ring;
- c is an integer from 0-5, with the proviso that when c=5, f=g=0;
- d is an integer from 0-5, with the proviso that when d=5, g=0;
- e is an integer from 0-5;
- f is an integer from 0-5
- g is 0 or 1.

In some embodiments of Formula III, f=0.

In some embodiments of any of Formulae I, II, and II(a) through II(f), a=0 or 1.

In some embodiments of Formulae I, II, and II(a) through II(f), $R^3$ is H or D.

In some embodiments of any of Formulae II and II(a) through II(f), $R^4$ is hydrocarbon aryl, an N,O,S-heterocycle, or a deuterated analog thereof. In some embodiments, $R^4$ is an N-heterocycle which is pyridine, pyrimidine, triazine, pyrrole, or a deuterated analog thereof. In some embodiments, $R^4$ is an O-heterocycle which is dibenzopyran, dibenzofuran, or a deuterated analog thereof. In some embodiments, $R^4$ is an S-heterocycle which is dibenzothiophene. In some embodiments, $R^4$ is D, naphthyl, substituted naphthyl, styryl, pyridine, pyrimidine, triazine, or a substituent of Formula IIII, as defined above.

In some embodiments of Formulae II and II(a) through II(f), $R^4$ is phenyl, biphenyl, terphenyl, or a deuterated analog thereof. In some embodiments, $R^4$ is phenyl having a vinyl or allyl substituent, biphenyl having a vinyl or allyl substituent, terphenyl having a vinyl or ally substituent, or a deuterated analog thereof.

In some embodiments, the first host compound has Formula IV

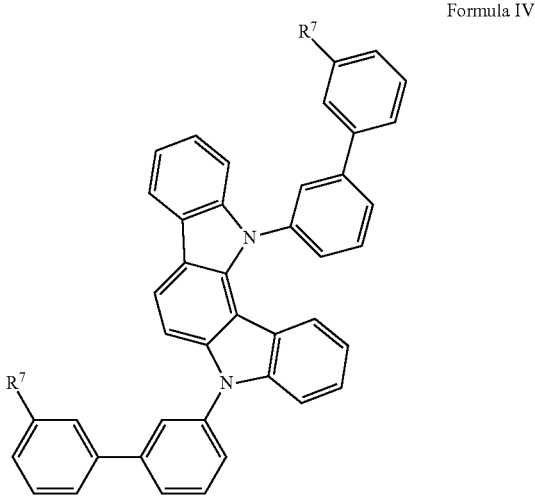

Formula IV where $R^7$ is H, D, phenyl, or deuterated phenyl.

In some embodiments, the first host is a compound having a single unit of Formula I. In some embodiments, first host is a compound having a single unit of Formula II.

In some embodiments, the first host is an oligomer or polymer having two or more units of Formula I. In some embodiments, the oligomer or polymer has two or more units of Formula II.

In some embodiments, the first host is a copolymer with one first monomeric unit having Formula I and at least one second monomeric unit. In some embodiments, the second monomeric unit also has Formula I, but is different from the first monomeric unit.

In some embodiments, the first host is a copolymer with one first monomeric unit having Formula II and at least one second monomeric unit. In some embodiments, the second monomeric unit also has Formula II, but is different from the first monomeric unit.

In some embodiments, the second monomeric unit is an arylene. Some examples of second monomeric units include, but are not limited to, phenylene, naphthylene, triarylamine, fluorene, N-heterocyclic, dibenzofuran, dibenzopyran, dibenzothiophene, and deuterated analogs thereof.

In some embodiments of the compound having at least one unit of any one of Formulae I, II, and II(a) through II(e), there can be any combination of the following:
- (i) deuteration;
- (ii) $R^2$ is aryl or deuterated aryl;
- (iii) $R^1$ is hydrocarbon aryl, an N,O,S-heterocycle, or a deuterated analog thereof;
- (iv) a=0 or 1; (v) $R^3$ is H or D;
- (v) $R^4$ is hydrocarbon aryl, an N,O,S-heterocycle, or a deuterated analog thereof;
- (vi) the compound has a single unit of Formulae I, II, or II(a) through II(e), or the compound has two or more units of Formulae I, II, or II(a) through II(e), or the compound is a copolymer with two or more units of Formulae I, II, or II(a) through II(e).

Some non-limiting examples of compounds having at least one unit of Formula I are given below.
Compound H1
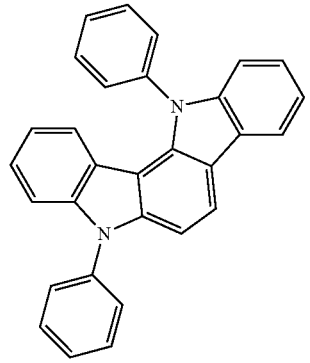
Compound H2
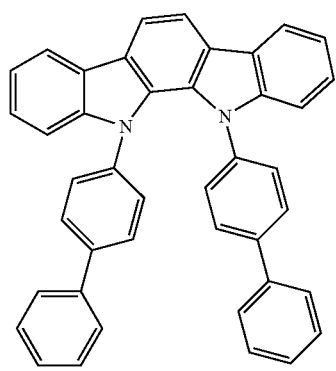
Compound H3
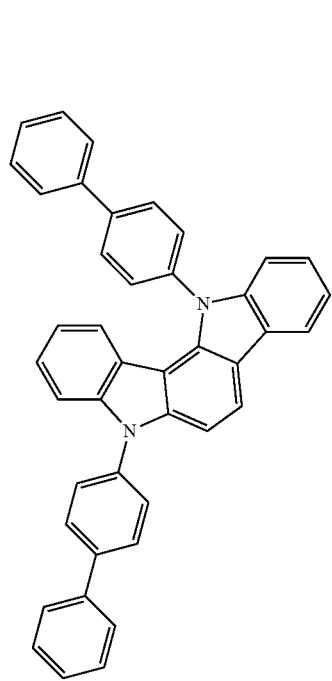
Compound H4
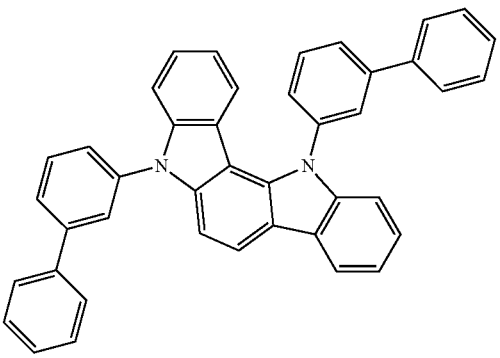
Compound H5
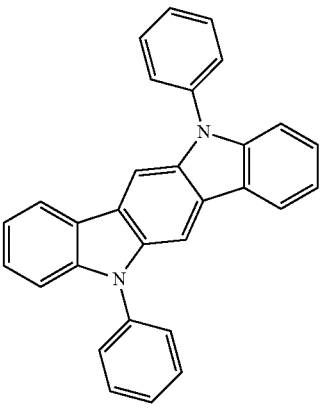
Compound H6
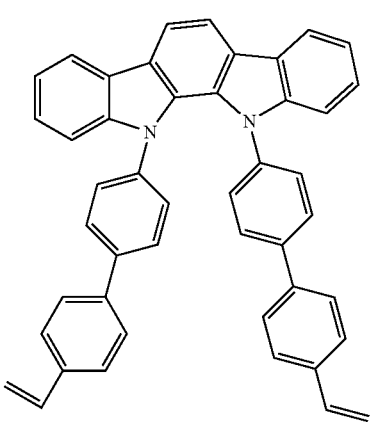
Compound H7
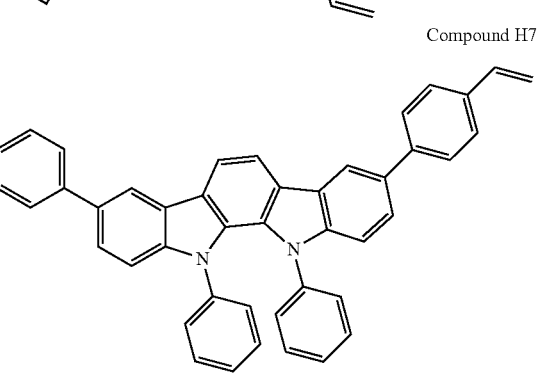

Compound H8
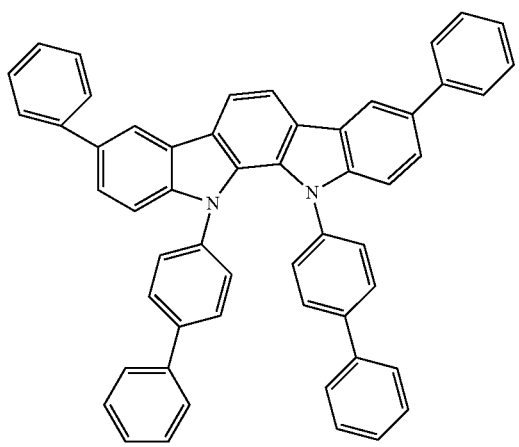
Compound H9
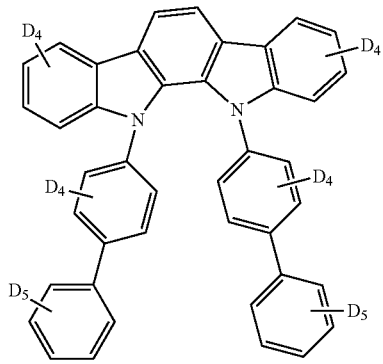
Coompound H10
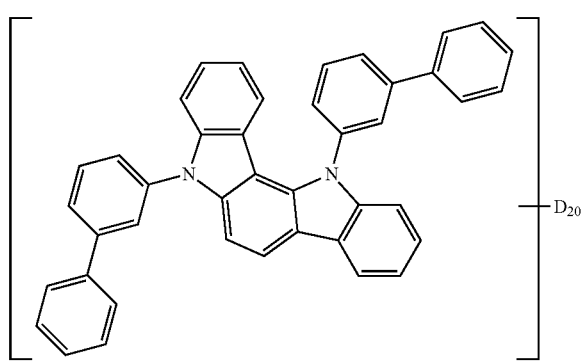
Compound H11
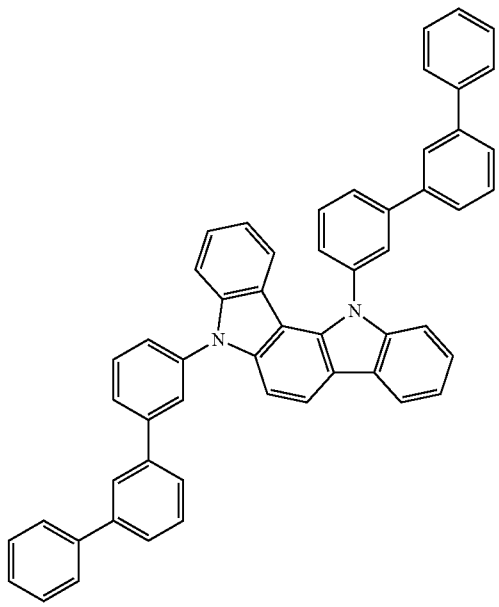
Compound H12
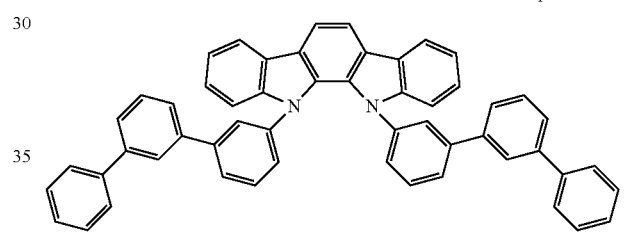
Compound H13
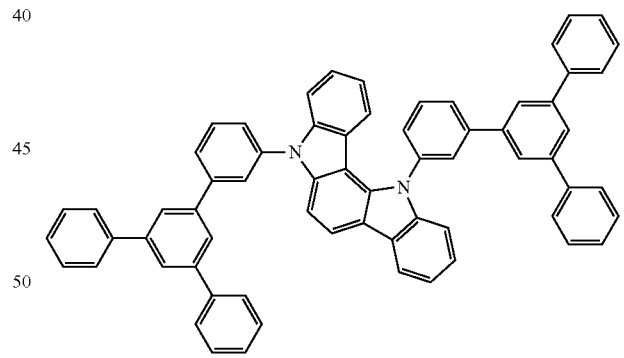
Compound H14
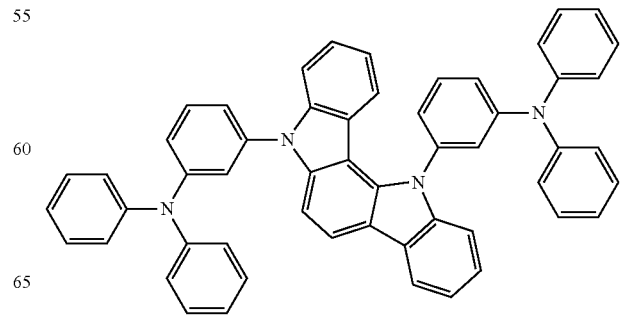

-continued
Compound H15
Compound H16
Compound H17
Compound H18
Compound H19
Compound H20
Compound H21
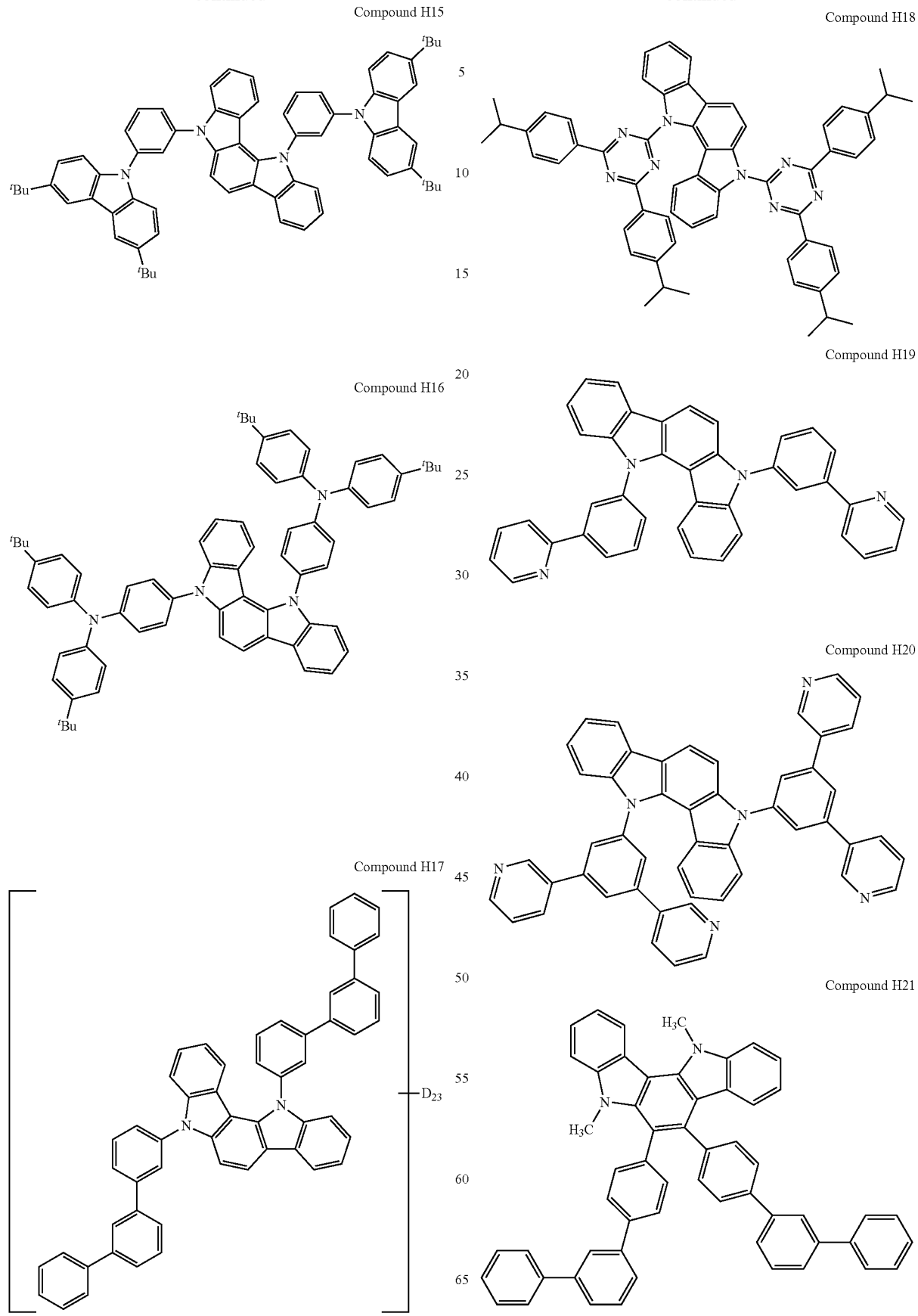

Compound H22

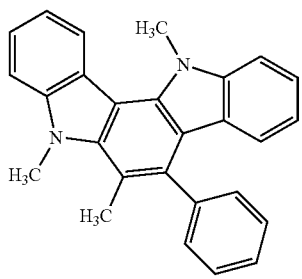

Compound H23

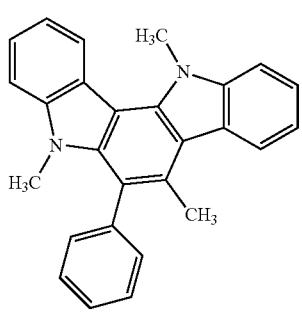

Compound H24

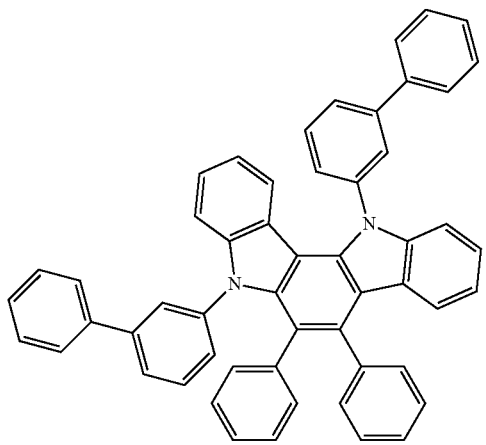

Compound H25

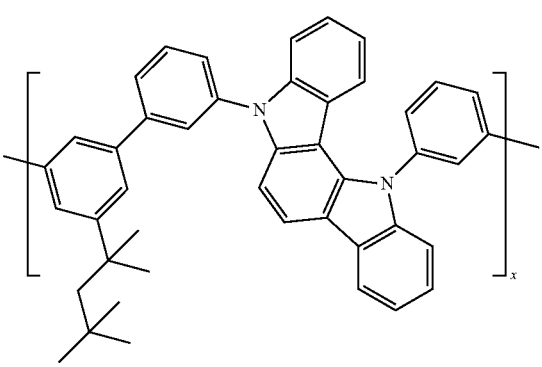

Compound H26

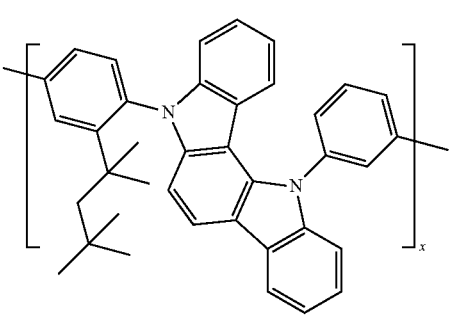

Compound H27

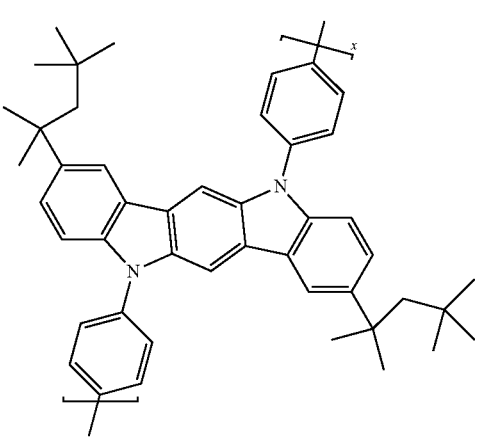

where x > 10

In the above compounds, "'Bu" represents a t-butyl group.

The compounds having Formula I can be prepared by known coupling and substitution reactions. Such reactions are well-known and have been described extensively in the literature. Exemplary references include Hartwig, J., Synlett 2006, No. 9, pp. 1283-1294; Hartwig, J., Nature 455,No. 18, pp. 314-322; Buchwald, S. L., et al., Adv. Synth. Catal, 2006, 348, 23-39; Buchwald, S. L., et al., Acc. Chem. Res. (1998), 37, 805-818; and Buchwald, S. L., et al., J. Organomet. Chem. 576 (1999), 125-146.

The deuterated analog compounds can be prepared in a similar manner using deuterated precursor materials or, more generally, by treating the non-deuterated compound with deuterated solvent, such as d6-benzene, in the presence of a Lewis acid H/D exchange catalyst, such as aluminum trichloride or ethyl aluminum chloride, or acids such as $CF_3COOD$, DCl, etc. Deuteration reactions have also been described in copending application published as PCT application WO 2011-053334.

The compounds described herein can be formed into films using any known deposition technique. In some embodiments, the compounds are formed into films using liquid deposition techniques.

(c) Second Host

In some embodiments, the second host is deuterated. In some embodiments, the second host is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the second host is 100% deuterated.

Examples of second host materials include, but are not limited to, indolocarbazoles, chrysenes, phenanthrenes, triphenylenes, phenanthrolines, triazines, naphthalenes, anthracenes, quinolines, isoquinolines, quinoxalines, phenylpyridines, benzodifurans, metal quinolinate complexes, and deuterated analogs thereof.

In some embodiments, the second host is a triazine, an indolocarbazole having an N-heterocycle substituent, or a deuterated analog thereof. Such host compositions have been described in, for example. published US patent application US 2010/0187977, published PCT application WO 2008/025997, and copending application [UC0982], respectively.

In some embodiments, the second host has Formula V

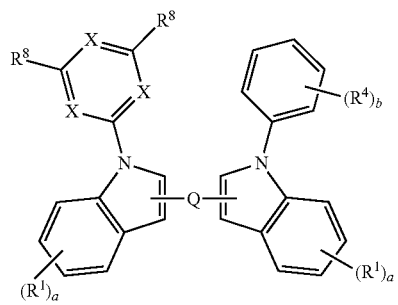

Formula V wherein:

Q is a fused ring linkage having the formula

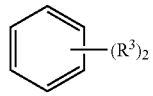

$R^1$ is the same or different at each occurrence and is D, alkyl, aryl, silyl, alkoxy, aryloxy, cyano, vinyl, or allyl;

$R^3$ is the same or different at each occurrence and is H, D, cyano, alkyl, or aryl;

$R^4$ is the same or different at each occurrence and is D, aryl, silyl, alkoxy, aryloxy, cyano, vinyl, allyl, dialkylamino, diarylamino, carbazole, pyridine, pyrimidine, triazine, dibenzothiophene, dibenzopyran, or a deuterated analog thereof $R^8$ is the same or different at each occurrence and is H, D, alkyl, or aryl, or $R^8$ may form a fused 5- or 6-membered ring;

X is the same or different at each occurrence and is CH or N, with the proviso that at least one X is N;

a is the same or different at each occurrence and is an integer from 0-4; and b is the same or different at each occurrence and is an integer from 0-5.

In some embodiments of Formula V, all X=N. In some embodiments, $R^1$, $R^3$, and $R^4$ are D or aryl. In some embodiments, $R^8$ is H or D. In some embodiments of Formula V, there can be any combination of the following: (i) all X=N; (ii) $R^1$, $R^3$, and $R^4$ are D or aryl; (iii) $R^8$ is H or D.

In some embodiments, the second host has Formula VI

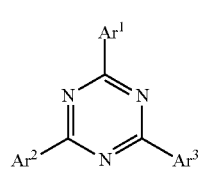

Formula VI wherein $Ar^1$, $Ar^2$, and $Ar^3$ are the same or different and are H, D, or aryl groups, with the proviso that at least two of $Ar^1$, $Ar^2$, and $Ar^3$ are aryl groups.

In some embodiments of Formula VI, the aryl groups are phenyl, naphthyl, substituted naphthyl, styryl, pyridine, pyrimidine, triazine, a deuterated analog thereof, or a substituent of Formula III where $R^5$ and $R^6$ are D, alkyl or aryl. In some embodiments of Formula VI, at least one aryl group has a substituent group that is phenyl, naphthyl, carbazolyl, diphenylcarbazolyl, triphenylsilyl, pyridyl, or a deuterated analog thereof. In some embodiments of Formula VI, there can be any combination of the following: (i) the aryl groups are phenyl, naphthyl, substituted naphthyl, styryl, pyridine, pyrimidine, triazine, a deuterated analog thereof, or a substituent of Formula III where $R^5$ and $R^6$ are D, alkyl or aryl; (ii) at least one aryl group has a substituent group that is phenyl, naphthyl, carbazolyl, diphenylcarbazolyl, triphenylsilyl, pyridyl, or a deuterated analog thereof.

3. Organic Electronic Device

Organic electronic devices that may benefit from having one or more layers comprising the deuterated materials described herein include, but are not limited to, (1) devices that convert electrical energy into radiation (e.g., a light-emitting diode, light-emitting diode display, light-emitting luminaire, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a thin film transistor or diode). The compounds of the invention often can be useful in applications such as oxygen sensitive indicators and as luminescent indicators in bioassays.

In one embodiment, an organic electronic device comprises at least one layer comprising the compound having at least one unit of Formula I as discussed above.

a. First Exemplary Device

A particularly useful type of transistor, the thin-film transistor (TFT), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, $2^{nd}$ edition, John Wiley and Sons, page 492). These components can be assembled in a variety of configurations. An organic thin-film transistor (OTFT) is characterized by having an organic semiconductor layer.

In one embodiment, an OTFT comprises:
a substrate
an insulating layer;
a gate electrode;
a source electrode;
a drain electrode; and an organic semiconductor layer comprising an electroactive compound having at least one unit of Formula I;
wherein the insulating layer, the gate electrode, the semiconductor layer, the source electrode and the drain electrode can be arranged in any sequence provided that the gate electrode and the semiconductor layer both contact the insulating layer, the source electrode and the drain electrode both contact the semiconductor layer and the electrodes are not in contact with each other. In some embodiments, the electroactive compound has at least one unit of Formula II(a), II(b), II(d), or II(e), as discussed above. In some embodiments, the electroactive compound has at least one unit of Formula II(a) or Formula II(b).

In FIG. 1A, there is schematically illustrated an organic field effect transistor (OTFT) showing the relative positions of the electroactive layers of such a device in "bottom contact mode." (In "bottom contact mode" of an OTFT, the drain and source electrodes are deposited onto the gate dielectric layer prior to depositing the electroactive organic semiconductor layer onto the source and drain electrodes and any remaining exposed gate dielectric layer.) A substrate 112 is in contact with a gate electrode 102 and an insulating layer 104 on top of which the source electrode 106 and drain electrode 108 are deposited. Over and between the source and drain electrodes are an organic semiconductor layer 110 comprising an electroactive compound having at least one unit of Formula I.

Figure 1B:
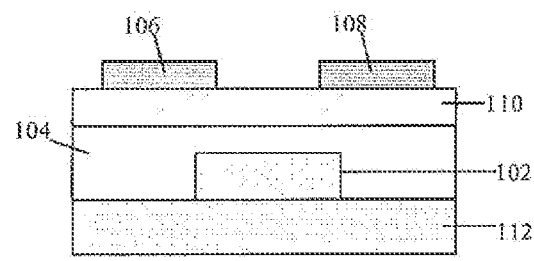
FIG. 1B includes a schematic diagram of an OTFT showing the relative positions of the electroactive layers of such a device in top contact mode.

FIG. 1B is a schematic diagram of an OTFT showing the relative positions of the electroactive layers of such a device in top contact mode. (In "top contact mode," the drain and source electrodes of an OTFT are deposited on top of the electroactive organic semiconductor layer.)

Figure 1C:
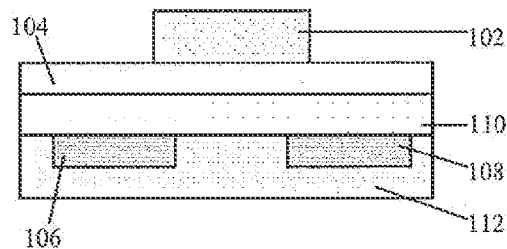
FIG. 1C includes a schematic diagram of an organic field effect transistor (OTFT) showing the relative positions of the electroactive layers of such a device in bottom contact mode with the gate at the top.

FIG. 1C is a schematic diagram of OTFT showing the relative positions of the electroactive layers of such a device in bottom contact mode with the gate at the top.

Figure 1D:
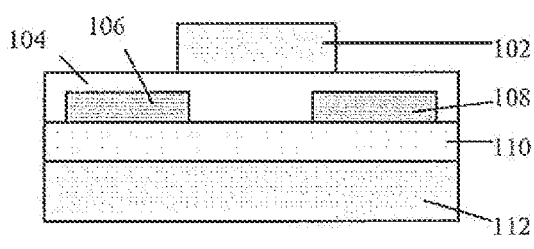
FIG. 1D includes a schematic diagram of an organic field effect transistor (OTFT) showing the relative positions of the electroactive layers of such a device in bottom contact mode with the gate at the top.

FIG. 1D is a schematic diagram of an OTFT showing the relative positions of the electroactive layers of such a device in top contact mode with the gate at the top.

The substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS)), filled polymeric materials (for example, fiber-reinforced plastics (FRP)), and/or coated metallic foils. The thickness of the substrate can be from about 10 micrometers to over 10 millimeters; for example, from about 50 to about 100 micrometers for a flexible plastic substrate; and from about 1 to about 10 millimeters for a rigid substrate such as glass or silicon. Typically, a substrate supports the OTFT during manufacturing, testing, and/or use. Optionally, the substrate can provide an electrical function such as bus line connection to the source, drain, and electrodes and the circuits for the OTFT.

The gate electrode can be a thin metal film, a conducting polymer film, a conducting film made from conducting ink or paste or the substrate itself, for example heavily doped silicon. Examples of suitable gate electrode materials include aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders. In some OTFTs, the same material can provide the gate electrode function and also provide the support function of the substrate. For example, doped silicon can function as the gate electrode and support the OTFT.

The gate electrode can be prepared by vacuum evaporation, sputtering of metals or conductive metal oxides, coating from conducting polymer solutions or conducting inks by spin coating, casting or printing. The thickness of the gate electrode can be, for example, from about 10 to about 200 nanometers for metal films and from about 1 to about 10 micrometers for polymer conductors.

The source and drain electrodes can be fabricated from materials that provide a low resistance ohmic contact to the semiconductor layer, such that the resistance of the contact between the semiconductor layer and the source and drain electrodes is less than the resistance of the semiconductor layer. Channel resistance is the conductivity of the semiconductor layer. Typically, the resistance should be less than the channel resistance. Typical materials suitable for use as source and drain electrodes include aluminum, barium, calcium, chromium, gold, silver, nickel, palladium, platinum, titanium, and alloys thereof; carbon nanotubes; conducting polymers such as polyaniline and poly(3,4-ethylenedioxythiophene)/poly-(styrene sulfonate) (PEDOT:PSS); dispersions of carbon nanotubes in conducting polymers; dispersions of a metal in a conducting polymer; and multilayers thereof. Some of these materials are appropriate for use with n-type semiconductor materials and others are appropriate for use with p-type semiconductor materials, as is known to those skilled in the art. Typical thicknesses of source and drain electrodes are about, for example, from about 40 nanometers to about 1 micrometer. In some embodiments, the thickness is about 100 to about 400 nanometers.

The insulating layer comprises an inorganic material film or an organic polymer film. Illustrative examples of inorganic materials suitable as the insulating layer include aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of the aforesaid materials can be used for the insulating layer. Illustrative examples of organic polymers for the insulating layer include polyesters, polycarbonates, poly(vinyl phenol), polyimides, polystyrene, poly(methacrylate)s, poly(acrylate)s, epoxy resins and blends and multilayers thereof. The thickness of the insulating layer is, for example from about 10 nanometers to about 500 nanometers, depending on the dielectric constant of the dielectric material used. For example, the thickness of the insulating layer can be from about 100 nanometers to about 500 nanometers. The insulating layer can have a conductivity that is, for example, less than about $10^{-12}$ S/cm (where S=Siemens=1/ohm).

The insulating layer, the gate electrode, the semiconductor layer, the source electrode, and the drain electrode are formed in any sequence as long as the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The gate electrode, the source electrode, and the drain electrode can be provided using known methods such as physical vapor deposition (for example, thermal evaporation or sputtering) or ink jet printing. The patterning of the electrodes can be accomplished by known methods such as shadow masking, additive photolithography, subtractive photolithography, printing, microcontact printing, and pattern coating.

For the bottom contact mode OTFT (FIG. 1A), electrodes 106 and 108, which form channels for source and drain respectively, can be created on the silicon dioxide layer using a photolithographic process. A semiconductor layer 110 is then deposited over the surface of electrodes 106 and 108 and layer 104.

In one embodiment, semiconductor layer 110 comprises one or more compounds having at least one unit of Formula I. The semiconductor layer 110 can be deposited by various techniques known in the art. These techniques include thermal evaporation, chemical vapor deposition, thermal transfer, ink-jet printing and screen-printing. Dispersion thin film coating techniques for deposition include spin coating, doctor blade coating, drop casting and other known techniques.

For top contact mode OTFT (FIG. 13), layer 110 is deposited on layer 104 before the fabrication of electrodes 106 and 108.

b. Second Exemplary Device

The present invention also relates to an electronic device comprising at least one electroactive layer positioned between two electrical contact layers, wherein the at least one electroactive layer of the device includes an electroactive compound having at least one unit of Formula I.

Figure 2:
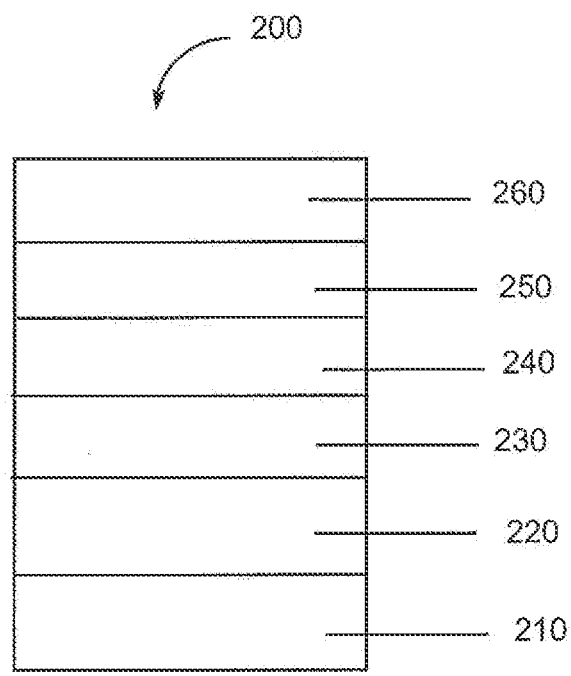
FIG. 2 includes a schematic diagram of another example of an organic electronic device.

Another example of an organic electronic device structure is shown in FIG. 2. The device 200 has a first electrical contact layer, an anode layer 210 and a second electrical contact layer, a cathode layer 260, and a photoactive layer 240 between them. Adjacent to the anode may be a hole injection layer 220. Adjacent to the hole injection layer may be a hole transport layer 230, comprising hole transport material. Adjacent to the cathode may be an electron transport layer 250, comprising an electron transport material. Devices may use one or more additional hole injection or hole transport layers (not shown) next to the anode 210 and/or one or more additional electron injection or electron transport layers (not shown) next to the cathode 260.

Layers 220 through 250 are individually and collectively referred to as the electroactive layers.

Figure 3:
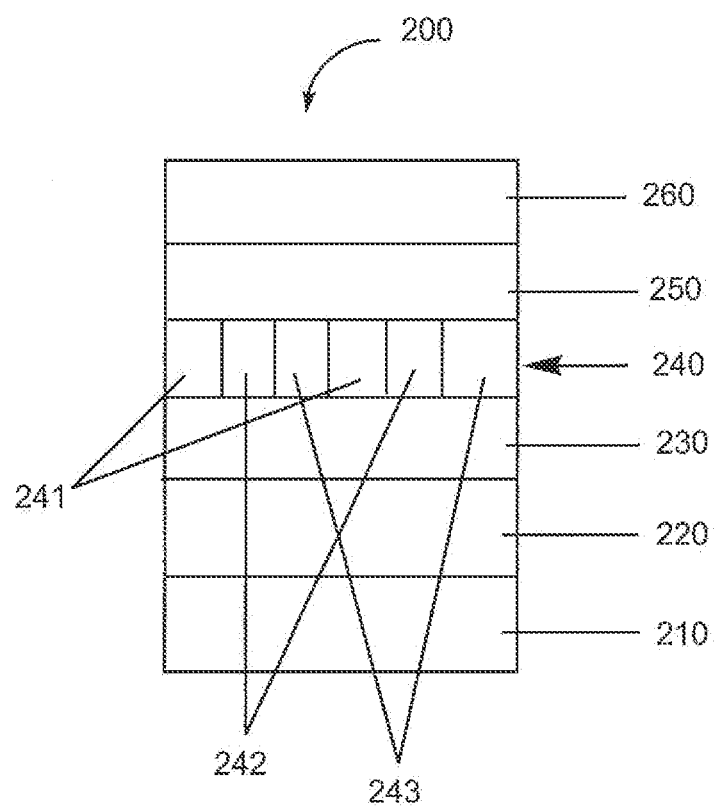
FIG. 3 includes a schematic diagram of another example of an organic electronic device.

In some embodiments, the photoactive layer 240 is pixellated, as shown in FIG. 3. Layer 240 is divided into pixel or subpixel units 241, 242, and 243 which are repeated over the layer. Each of the pixel or subpixel units represents a different color. In some embodiments, the subpixel units are for red, green, and blue. Although three subpixel units are shown in the figure, two or more than three may be used.

In one embodiment, the different layers have the following range of thicknesses: anode 210, 500-5000 Å, in one embodiment 1000-2000 Å; hole injection layer 220, 50-2000 Å, in one embodiment 200-1000 Å; hole transport layer 230, 50-2000 Å, in one embodiment 200-1000 Å; electroactive layer 240, 10-2000 Å, in one embodiment 100-1000 Å; layer 250, 50-2000 Å, in one embodiment 100-1000 Å; cathode 260, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used. In some embodiments, the devices have additional layers to aid in processing or to improve functionality.

Depending upon the application of the device 200, the photoactive layer 240 can be a light-emitting layer that is activated by an applied voltage (such as in a light-emitting diode or light-emitting electrochemical cell), or a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966). Devices with light-emitting layers may be used to form displays or for lighting applications, such as white light luminaires.

In some embodiments, the new composition described herein is useful as the photoactive layer 240. It has been found that when these compositions can provide improved efficiency and lifetime in OLED devices. It has been discovered through calculations that these compounds have high triplet energies and HOMO and LUMO levels appropriate for charge transport, making them excellent host materials for organometallic emitters. Structures based on indolo[3,2-a]carbazole have been discovered to have improved solubility properties (vs. other indolocarbazole isomers), making them especially suitable for solution deposition. These structures may be optionally substituted with functional groups that allow for cross-linking.

Photoactive Layer

In some embodiments, the photoactive layer comprises (a) a dopant capable of electroluminescence having an emission maximum between 380 and 750 nm, (b) a compound having at least one unit of Formula I, and (c) a second host.

In some embodiments, the dopant is an organometallic material. In some embodiments, the organometallic material is a complex of Ir or Pt. In some embodiments, the organometallic material is a cyclometallated complex of Ir.

In some embodiments, the photoactive layer consists essentially of (a) a dopant, (b) a first host material having at least one unit of Formula I, and (c) a second host material. In some embodiments, the photoactive layer consists essentially of (a) an organometallic complex of Ir or Pt, (b) a first host material having at least one unit of Formula I, and (c) a second host material. In some embodiments, the photoactive layer consists essentially of (a) a cyclometallated complex of Ir, (b) a first host material having at least one unit of Formula I, and (c) a second host material.

In some embodiments, the photoactive layer consists essentially of (a) a dopant, (b) a first host material having at least one unit of Formula II, and (c) a second host material. In some embodiments, the photoactive layer consists essentially of (a) an organometallic complex of Ir or Pt, (b) a first host material having at least one unit of Formula II, and (c) a second host material. In some embodiments, the photoactive layer consists essentially of (a) an cyclometallated complex of Ir, (b) a first host material having at least one unit of Formula II, and (c) a second host material.

In some embodiments, the photoactive layer consists essentially of (a) a dopant, (b) a first host material having at least one unit of Formula I, wherein the compound is deuterated, and (c) a second host material. In some embodiments, the photoactive layer consists essentially of (a) an organometallic complex of Ir or Pt, (b) a first host material having at least one unit of Formula I, wherein the compound is deuterated, and (c) a second host material. In some embodiments, the photoactive layer consists essentially of (a) a cyclometallated complex of Ir, (b) a first host material having at least one unit of Formula I, wherein the compound is deuterated, and (c) a second host material. In some embodiments, the deuterated compound having at least one unit of Formula I is at least 10% deuterated; in some embodiments, at least 50% deuterated. In some embodiments, the second host material is deuterated. In some embodiments, the second host material is at least 10% deuterated; in some embodiments, at least 50% deuterated.

In some embodiments, the photoactive layer consists essentially of (a) a dopant, (b) a first host material having at least one unit of Formula II, wherein the compound is deuterated, and (c) a second host material. In some embodiments, the photoactive layer consists essentially of (a) an organometallic complex of Ir or Pt, (b) a first host material having at least one unit of Formula II, wherein the compound is deuterated, and (c) a second host material. In some embodiments, the photoactive layer consists essentially of (a) a cyclometallated complex of Ir, (b) a first host material having at least one unit of Formula II, wherein the compound is deuterated, and (c) a second host material. In some embodiments, the deuterated compound having at least one unit of Formula II is at least 10% deuterated; in some embodiments, at least 50% deuterated. In some embodiments, the second host material is deuterated. In some embodiments, the second host material is at least 10% deuterated; in some embodiments, at least 50% deuterated.

Other Device Layers

The other layers in the device can be made of any materials that are known to be useful in such layers.

The anode 210, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 210 can also comprise an organic material such as polyaniline as described in "Flexible light-emitting diodes made from soluble conducting polymer," Nature vol. 357, pp 477-479 (11 Jun. 1992). At least one of the anode and cathode is desirably at least partially transparent to allow the generated light to be observed.

The hole injection layer 220 comprises hole injection material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules. They may be vapour deposited or deposited from liquids which may be in the form of solutions, dispersions, suspensions, emulsions, colloidal mixtures, or other compositions.

The hole injection layer can be formed with polymeric materials, such as polyaniline (PAN) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The hole injection layer can comprise charge transfer compounds, and the like, such as copper phthalocyanine and the tetrathiafulvalene-tetracyanoquinodimethane system (TTF-TCNQ).

In some embodiments, the hole injection layer comprises at least one electrically conductive polymer and at least one fluorinated acid polymer. Such materials have been described in, for example, published U.S. patent applications US 2004/0102577, US 2004/0127637, US 2005/0205860, and published PCT application WO 2009/018009.

In some embodiments, the hole transport layer 230, comprises a compound having at least one unit of Formula I. In some embodiments, the hole transport layer 230 consists essentially of a compound having at least one unit of Formula I. In some embodiments, the hole transport layer 230 comprises a compound having at least one unit of Formula I wherein the compound is deuterated. In some embodiments, the compound is at least 50% deuterated. In some embodiments, the hole transport layer 230 consists essentially of a compound having at least one unit of Formula I wherein the compound is deuterated. In some embodiments, the compound is at least 50% deuterated.

Examples of other hole transport materials for layer 230 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), N,N'-bis(naphthalen-1-yl)-N,N'-bis-(phenyl)benzidine (α-NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. In some embodiments, the hole transport layer further comprises a p-dopant. In some embodiments, the hole transport layer is doped with a p-dopant. Examples of p-dopants include, but are not limited to, tetrafluorotetracyanoquinodimethane (F4-TCNQ) and perylene-3,4,9,10-tetracarboxylic-3,4,9,10-dianhydride (PTCDA).

In some embodiments, the electron transport layer 250 comprises the compound having at least one unit of Formula I. Examples of other electron transport materials which can be used in layer 250 include, but are not limited to, metal chelated oxinoid compounds, including metal quinolate derivatives such as tris(8-hydroxyquinolato)aluminum (AlQ), bis(2-methyl-8-quinolinolato)(p-phenylphenolato)aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

Layer 250 can function both to facilitate electron transport, and also serve as a buffer layer or confinement layer to prevent quenching of the exciton at layer interfaces. Preferably, this layer promotes electron mobility and reduces exciton quenching.

The cathode 260, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li- or Cs-containing organometallic compounds, LiF, CsF, and $Li_2O$ can also be deposited between the organic layer and the cathode layer to lower the operating voltage.

It is known to have other layers in organic electronic devices. For example, there can be a layer (not shown) between the anode 210 and hole injection layer 220 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 210, electroactive layers 220, 230, 240, and 250, or cathode layer 260, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device can be prepared by a variety of techniques, including sequential vapor deposition of the individual layers on a suitable substrate. Substrates such as glass, plastics, and metals can be used. Conventional vapor deposition techniques can be used, such as thermal evaporation, chemical vapor deposition, and the like. Alternatively, the organic layers can be applied from solutions or dispersions in suitable solvents, using conventional coating or printing techniques, including but not limited to spin-coating, dip-coating, roll-to-roll techniques, ink-jet printing, screen-printing, gravure printing and the like.

To achieve a high efficiency LED, the HOMO (highest occupied molecular orbital) of the hole transport material desirably aligns with the work function of the anode, and the LUMO (lowest un-occupied molecular orbital) of the electron transport material desirably aligns with the work function of the cathode. Chemical compatibility and sublimation temperature of the materials may also be considerations in selecting the electron and hole transport materials.

It is understood that the efficiency of devices made with the indolocarbazole compounds described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

EXAMPLES

The following examples illustrate certain features and advantages of the present invention. They are intended to be illustrative of the invention, but not limiting. All percentages are by weight, unless otherwise indicated.

Synthesis Example 1

The core indolocarbazole materials are shown below.

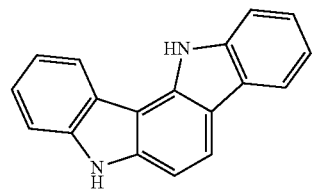
[3,2-a]

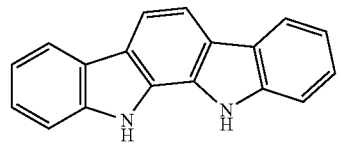
[2,3-a]

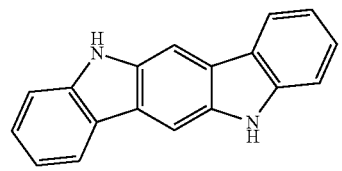
[3,2-b]

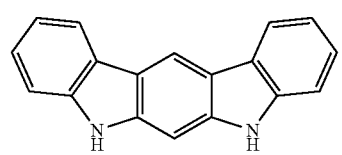
[2,3-b]

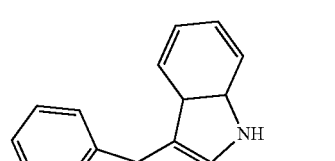
[2,3-c]

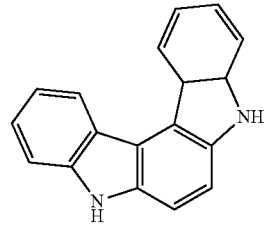

Indolo[3,2-a]carbazole was synthesized according to a literature procedure from 2,3'-biindolyl: Janosik, T.; Bergman, J. Tetrahedron (1999), 55, 2371. 2,3'-biindolyl was synthesized according to the procedure described in Robertson, N.; Parsons, S.; MacLean, E. J.; Coxall, R. A.; Mount, Andrew R. Journal of Materials Chemistry (2000), 10, 2043.

Indolo[2,3-a]carbazole was synthesized according to the procedure found in EP2080762A1 (Nippon Steel Co., Ltd.; filed Aug. 11, 2007).

Indolo[3,2-b]carbazole was synthesized from commercially available 3,3'-methylenediindole according to the procedure found in; Pindur, U.; Müller, J. Arch. Pharm. (1987), 320, 280.

Indolo[2,3-b]carbazole can be synthesized according to the procedure found in Knolker, Hans-Joachim; Reddy, Kethiri R. Tetrahedron Letters (1998), 39(23), 4007-4008.

Indolo[2,3-c]carbazole can be synthesized according to the procedure found in Desarbre, Eric and Bergman, Jan; Journal of the Chemical Society, Perkin Transactions 1: Organic and Bio-Organic Chemistry, (13), 2009-2016; 1998

Synthesis Example 2

This example illustrates the preparation of Compound H1; 5,12-diphenyl-5,12-dihydroindolo[3,2-a]carbazole.

Indolo[3,2-a]carbazole (0.68 g, 2.7 mmol) was suspended in 28 ml of o-xylene under nitrogen and treated with iodobenzene (1.18 g, 5.8 mmol) followed by the sodium t-butoxide (0.80 g, 8.3 mmol), tri-t-butylphosphine (0.09 g, 0.44 mmol) and palladium dibenzylideneacetone (0.20 g, 0.22 mmol). The resulting mixture was heated to 117-119° C. and stirred overnight. It was then cooled to room temperature filtered through a short pad of silica gel and the pad washed thoroughly with o-xylene. The combined filtrates were concentrated to dryness to a dark oily solid. The crude material was purified by conventional flash chromatography on silica gel using 2.5% ether/hexane as the eluent to afford 1.04 g of a light-tan solid. This material was then further purified using a Biotage® automated flash purification system to afford 0.57 g of N,N'-bis(phenyl)-indolo[3,2-a]carbazole as a white solid with a purity of 99.99%. MP=166° C.; Tg=80.5° C.

Synthesis Example 3

This example illustrates the preparation of Compound H3: 5,12-di([1,1'-biphenyl]-4-yl)-5,12-dihydroindolo[3,2-a]carbazole.

Indolo[3,2-a]carbazole (1.00 g, 3,9 mmol) was suspended in 39 ml of o-xylene under nitrogen and treated with 4-iodo-1,1'-binphenyl (2.29 g, 8.18 mmol) followed by the sodium t-butoxide (1.12 g, 11.7 mmol), tri-t-butylphosphine (0.13 g, 0.62 mmol) and palladium dibenzylideneacetone (0.29 g, 0.31 mmol). The resulting mixture was heated to 128° C. and stirred for 30 minutes. It was then cooled to room temperature filtered through a short pad of silica. The silica pad was washed with toluene and the combined extracts concentrated to dryness to afford a tan-colored solid. The crude material was purified by conventional flash chromatography on silica gel using 25% methylene chloride/hexane as the eluent to afford 0.75 g of material. Further purification using a Biotage® automated flash purification system followed by recrystallization from hot toluene afforded 0.31 g of N,N'-bis ([1,1'-biphenyl]-4-yl)indolo[3,2-a]carbazole. MP=314.6° C.; Tg=116.0° C.

Synthesis Example 4

This example illustrates the preparation of Compound H4: 5,12-di([1,1'-biphenyl]-3-yl)-5,12-dihydroindolo[3,2-a]carbazole.

Indolo[3,2-a]carbazole (7.00 g, 27.3 mmol) was suspended in 270 ml of o-xylene under nitrogen and treated with 3-bromobiphenyl (13.4 g, 57.5 mmol) followed by the sodium t-butoxide (7.87 g, 81.9 mmol). The mixture was stirred and then treated with tri-t-butylphosphine (0.89 g, 4.4 mmol) followed by palladium dibenzylideneacetone (2.01 g, 2.2 mmol). The resulting dark-red suspension was warmed over a 20 minute period to 128-130° C., during which time the mixture became dark brown. Heating was maintained at 128-130° C. for 1.25 hours; the reaction mixture was then cooled to room temperature and filtered through a short pad of silica gel. The filtrate was concentrated to give a dark amber-colored glass. This material was chromatographed using chloroform/hexane as the eluent on a Biotage® automated flash purification system. The purest fractions were concentrated to dryness to afford 10.4 g of a white foam. The foam was dissolved in 35 mL of toluene and added dropwise to 400 mL of ethanol with stirring. A white solid precipitated during the addition. The solid was filtered off and dried to afford 7.35 g of N,N'-bis([1,1'-biphenyl]-3-yl)indolo[3,2-a]carbazole with a purity determined by UPLC of 99.46%. Subsequent purification by vacuum sublimation afforded material with a purity of 99.97% for testing in devices. Tg=113.0° C.

Synthesis Example 5

This example illustrates the preparation of Compound H5: 5,11-diphenyl-5,11-dihydroindolo[3,2-b]carbazole.

Indolo[3,2-b]carbazole (1.20 g, 4,68 mmol) was suspended in 48 ml of o-xylene under nitrogen and treated with iodobenzene (2.10 g, 10.3 mmol) followed by the sodium t-butoxide (1.35 g, 14.0 mmol), tri-t-butylphosphine (0.15 g, 0.74 mmol) and palladium dibenzylideneacetone (0.34 g, 0.37 mmol). The resulting mixture was heated to 120° C. and stirred for 20 minutes. It was then cooled to room temperature filtered through a short pad of silica gel and the pad washed with toluene. The combined filtrates were combined and concentrated to dryness to afford a dark-colored solid. Purification using a Biotage® automated flash purification system afforded 0.640 g of N,N'-bis(phenyl)-indolo[3,2-b]carbazole with a purity of 99.7%. MP=306.5° C.; Tg=238.9° C.

Synthesis Example 6

This example illustrates the preparation of Compound H11: 5,12-dihydro-5,12-bis(3'-phenylbiphenyl-3-yl)-indolo[3,2-a]carbazole.

To a 500 mL round bottle flask were added indolo[3,2-a]carbazole (5.09 (99%), 19.7 mmol), 3-bromo-3'-phenylbiphenyl (13.1 (98%), 41.3 mmol), sodium t-butoxide (5.7 g, 59.1 mmol), and 280 ml of o-xylene The system was purged with nitrogen with stirring for 15 min and then treated with palladium acetate (0.35 g, 1.6 mmol) followed by tri-t-butylphosphine (0.64 g, 3.1 mmol). The resulting red suspension was heated to 128-130° C. over a 20 minute period, during which time the mixture became dark brown. Heating was continued at 128-130° C. for 3 hours; the reaction mixture was then cooled to room temperature and filtered through a short chromatography column eluted with toluene. The solvent was removed by rotary evaporation and the resulted brownish foam was dissolved in 40 mL of methylene chloride. The solution was added dropwise to 500 mL of methanol with stirring. The precipitate was filtered and dried in a vacuum oven at give a brownish powder material. This material was chromatographed using chloroform/hexane as the eluent on a CombiFlash® automated flash purification system. The purest fractions were concentrated to dryness to afford a white foam. The foam was dissolved in 30 mL of toluene and added dropwise to 500 mL of methanol with stirring. A white solid precipitated during the addition. The solid was filtered off and dried to afford 9.8 g of 5,12-dihydro-5,12-bis(3'-phenylbiphenyl-3-yl)-indolo[3,2-a]carbazole with a purity determined by UPLC of 99.9%. Subsequent purification by vacuum sublimation afforded material with a purity of 99.99% for testing in devices. Tg=116.3° C.

Synthesis Example 7

This example illustrates the preparation of Compound H12: 11,12-bis(3'-phenylbiphenyl-3-yl)-11,12-dihydroindolo[2,3-a]carbazole.

To a 500 mL round bottle flask were added 11,12-dihydroindolo[2,3-a]carbazole (2.5 (99%), 9.7 mmol), 3-Iodo-3'-phenylbiphenyl (6.9 (98%), 19.5 mmol), sodium t-butoxide (2.8 g, 29.2 mmol), and 140 ml of o-xylene. The system was purged with nitrogen with stirring for 15 min and then treated with palladium acetate (0.17 g, 0.8 mmol) followed by tri-t-butylphosphine (0.32 g, 1.6 mmol). The resulting red suspension was heated to 128-130° C. over a 20 minute period, during which time the mixture became dark brown. Heating was continued at 128-130° C. for 3 hours; the reaction mixture was then cooled to room temperature and filtered through a short chromatography column eluted with toluene. The solvent was removed by rotary evaporation and the resulted brownish foam was dissolved in 20 mL of methylene chloride. The solution was added dropwise to 250 mL of methanol with stirring. The precipitate was filtered and dried in a vacuum oven to give a brownish powder material. This material was chromatographed using chloroform/hexane as the eluent on a CombiFlash® automated flash purification system. The purest fractions were concentrated to dryness to afford a white powder material. The material was crystallized from toluene/ethanol to afford 0.82 g of 11,12-bis(3'-phenyl-biphenyl-3-yl)-11,12-dihydroindolo[2,3-a]carbazole with a purity determined by UPLC of 98.7%. Subsequent purification by vacuum sublimation afforded material with a purity of 99.0% for testing in devices. Tg=115.5° C.

Synthesis Example 8

This example illustrates the preparation of Compound H13: 5,12-dihydro-5,12-bis(3',5'-diphenylbiphenyl-3-yl)-indolo[3,2-a]carbazole.

To a 250 mL round bottle flask were added indolo[3,2-a]carbazole (1.28 g, 99%, 4.98 mmol), 3'-bromo-3,5-diphenyl-biphenyl (4.02 g, 98%, 10.22 mmol), sodium t-butoxide (1.44 g, 14.94 mmol), and 90 ml of o-xylene. The system was purged with nitrogen with stirring for 15 min and then treated with palladium acetate (89 mg, 0.40 mmol) followed by tri-t-butylphosphine (161 mg, 0.80 mmol). The resulting red suspension was heated to 128-130° C. over a 20 minute period, during which time the mixture became dark brown. Heating was continued at 128-130° C. for 4 hours; the reaction mixture was then cooled to room temperature and filtered through a short chromatography column eluted with toluene. The solvent was removed by rotary evaporation and the resulted brownish foam was dissolved in 15 mL of methylene chloride. The solution was added dropwise to 250 mL of methanol with stirring. The precipitate was filtered and dried in a vacuum oven at give a brownish powder material. This material was chromatographed using chloroform/hexane as the eluent on a CombiFlash® automated flash purification system. The purest fractions were concentrated to dryness to afford a white foam. The foam was dissolved in 15 mL of toluene and added dropwise to 250 mL of methanol with stirring. A white solid precipitated during the addition. The solid was filtered off and dried to afford 3.1 g of 5,12-dihydro-5,12-bis(3',5'-diphenylbiphenyl-3-yl)-indolo[3,2-a]carbazole with a purity determined by UPLC of 99.9%.

Synthesis Example 9

This example illustrates the preparation of Compound H14: 3,3'-(indolo[3,2-a]carbazole-5,12-diyl)bis(N,N-diphenylaniline).

Indolo[3,2-a]carbazole (1.40 g, 5.46 mmol) was suspended in 55 ml of o-xylene under nitrogen and treated with N,N-diphenyl-3-bromoaniline (3.72 g, 11.47 mmol) followed by the sodium t-butoxide (1.58 g, 16.4 mmol). The mixture was stirred and then treated with tri-t-butylphosphine (0.18 g, 0.88 mmol) followed by palladium dibenzylideneacetone (0.40 g, 0.44 mmol). The resulting dark-red suspension was warmed over a 20 minute period to 130-132° C. After 1.25 h the reaction mixture was cooled to room temperature and filtered through a short pad of silica. The pad was washed several times with toluene and the combined filtrates concentrated to dryness to afford a tan-colored foam. This material was purified by chromatorgraphy using chloroform/hexane as the eluent on a Biotage® automated flash purification system, followed by recrystallization from chloroform. This afforded 1.165 grams of 3,3'-(indolo[3,2-a]carbazole-5,12-diyl)bis(N,N-diphenylaniline) as a white solid with a purity of 99.8%.

Synthesis Example 10

This example illustrates the preparation of Compound H15: 5,12-bis[3-(3,6-di-t-butyl-9H-carbazol-9-yl)phenyl]-5,12-dihydroindolo[3,2-a]carbazole.

Indolo[3,2-a]carbazole (1.00 g, 3.90 mmol) was suspended in 39 ml of o-xylene under nitrogen and treated with 4,7-di-t-butyl-N-(3-bromophenyl)carbazole (3.51g, 8.08 mmol) followed by the sodium t-butoxide (1.12 g, 11.7 mmol). The mixture was stirred and then treated with tri-t-butylphosphine (0.13 g, 0.62 mmol) followed by palladium dibenzylideneacetone (0.28 g, 0.31 mmol). The resulting mixture was stirred and heated at reflux for 1 hour. The mixture was then filtered through a pad of silica. The pad was washed thoroughly with toluene, the extracts combined, and then concentrated to dryness to afford a dark brown solid. This material was purified by chromatography using dichloromethane/hexane as the eluent on a Biotage® automated flash purification system. The purest fractions were combined and concentrated to dryness to give a colorless glass. The glass was dissolved in hexane; a white solid precipitated from the hexane solution after standing several minutes at room temperature. This was filtered off, and then recrystallized from dichloromethane/hexane to afford 1.13 g of 5,12-bis[3-(3,6-di-t-butyl-9H-carbazol-9-yl)phenyl]-5,12-dihydroindolo[3,2-a]carbazole as a white solid with a purity of ~100%.

Synthesis Example 11

This example illustrates the preparation of Compound H16: 4,4'-(indolo[3,2-a]carbazole-5,12-diyl)bis(N,N-bis(4-(t-butyl)phenyl)aniline).

This compound was synthesized in two steps as follows.

a) Under nitrogen, a 2 liter 3-neck round bottom flask equipped with a reflux condenser and thermocouple was charged with palladium dibenzylidene acetone (1.10 g, 1.2 mmol) and 300 mL of o-xylene. Bis(diphenylphosphino)ferrocene (1.10 g, 2.0 mmol) and sodium t-butoxide (11.6 g, 121.0 mmol) were then added. The resulting mixture was stirred for 30 minutes at room temperature and then bis(4-t-butylphenyl)amine (24.2 g, 85.9 mmol) was added followed by 4-bromoiodobenzene (26.6 g, 94.0 mmol). The red-purple mixture was heated to 90° C. over a period of 30 minutes and stirred for 17 h, resulting in a tan-colored suspension. The reaction mixture was cooled to room temperature and concentrated to dryness. The crude product was suspended in warm methylene chloride and passed through a silica gel column using methylene chloride as the eluent. When no more UV-active material was observed to come through the column, the fractions were combined and concentrated to give a dark oil, which eventually crystallized to afford a dark red solid. The solid was washed with cold hexane to afford 21.4 g of light tan-colored solid. This material was then taken up in 150 mL of warm hexane, filtered through a medium frit funnel, and the filtrate cooled to room temperature. A solid crystallized from the hexane, was filtered off, washed with cold hexane, and air-dried to afford 13.6 g of bis(4-t-butylphenyl)(4-bromophenyl) amine as a very pale tan-colored solid.

(b) Under nitrogen, indolo[3,2-a]carbazole (1.00 g, 3.90 mmol) was suspended in 39 mL of o-xylene. To this was added bis(4-t-butylphenyl)(4-bromophenyl)amine (3.53 g, 8.08 mmol), sodium t-butoxide (1.12 g, 11.7 mmol), tri-t-butyl phosphine (0.13 g, 0.62 mmol), and palladium dibenzylidene acetone (0.28 g, 0.31 mmol). The resulting mixture was heated to reflux to give a dark-red suspension. After 3 hours the reaction mixture was cooled to room temperature and filtered through a pad of silica gel. The silica gel pad was washed several times with o-xylene. The filtrates were combined and concentrated to dryness affording an amber-colored glass. This material was purified by chromatorgraphy using dichloromethane/hexane as the eluent on a Biotage® automated flash purification system. The purest fractions were combined and concentrated to dryness to afford 1.68 g of 4,4°-(indolo[3,2-a]carbazole-5,12-diyl)bis(N,N-bis(4-(t-butyl)phenyl)aniline) as a white solid with a purity of ~99.94%.

Synthesis Examples 12 and 13

These examples illustrate the formation of deuterated materials H10 and H17.

Compound H10 was made starting from Compound H4 and Compound H17 was made starting from Compound H11. The nondeuterated starting compounds were treated with triflic acid in d6-benzene, as described in copending U.S. application [UC0917].

Compound H10 was analyzed to have 20 H replaced with D.

Compound H17 was analyzed to have 23 H replaced with D.

Synthesis Example 14

This example illustrates the preparation of Compound H18.

Sodium hydride (120 mg, 5 mmol) was placed into a 100 ml Schlenk flask and suspended in 10 ml of dry DMF. In a separate flask, indolo[3,2-a]carbazole (512 mg, 2 mmol) was dissolved in 20 ml of dry DMF and the resulting solution was added to the flask with NaH. Evolution of a gas was observed and reaction mixture darkened. It was left to stir at room temperature for 1 hour. Solution of 2-chloro-4,6-bis(4-isopropylphenyl)-1,3,5-triazine (1.51 g, 4.04 mmol) in 20 ml of dry DMF was added by syringe and the reaction mixture was left to stir at room temperature overnight. Next day, reaction mixture was poured into 500 ml of water and the resulting slurry was stirred for 2 hours. The formed precipitate was filtered and dried on air. Crude product was purified by flash chromatography to give 0.7 g of white powder (39.4%). 1H NMR and mass spectrometry were consistent with the structure of the desired product.

Synthesis Examples 15-17

These examples illustrate the preparation of second host compounds.

Synthesis Example 15

This example illustrates the preparation of second host, SH-1. In this and all other structures, "Ph" represents a phenyl group,

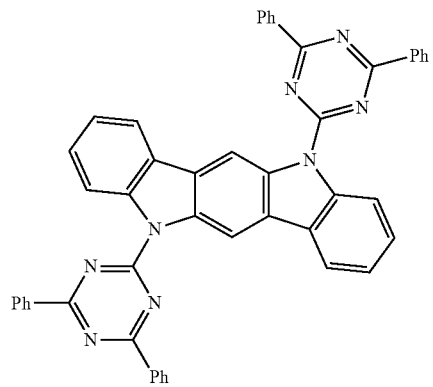

Under nitrogen, sodium hydride (0.28 g, 11.7 mmol) was suspended in 8 mL of anhydrous dimethyl foramide (DMF). To this was added a solution of indolo[3,2-b]carbazole (1.20 g, 4.68 mmol) in 10 mL of DMF over a 10 min period. The resulting mixture was stirred for 1 h and then a suspension of 79% (w/w) 2-chloro-4,6-diphenyl-1,3,5-triazine (3.15 g, 9.30 mmol) was added over a period of 1 h. The reaction mixture was stirred overnight, and the reaction was then quenched by the careful addition of water (105 mL). The solid that precipitated was separated by filtration and then washed with water followed by methanol It was dried to afford an off-white solid (2.07 g). Mass spectroscopy was consistent with the assigned structure (m/z=718).

Synthesis Example 16

This example illustrates the preparation of second host SH-2.

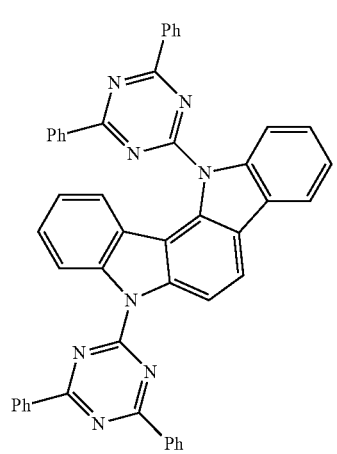

Under nitrogen, sodium hydride (0.16 g, 6.8 mmol) was suspended in 5 mL of anhydrous dimethyl foramide (DMF). To this was added a solution of indolo[3,2-a]carbazole (0.70 g, 2.73 mmol) in 10 mL of DMF over a 10 min period. The resulting mixture was stirred for 1 h and then a suspension of 93% (wiw) 2-chloro-4,6-diphenyl-1,3,5-triazine (1.59 g, 5.52 mmol) was added over a period of 20 min. The reaction mixture was stirred overnight, and the reaction was then quenched by the careful addition of water. It was then added to 200 mL of water. A solid precipitated and was separated by filtration and further washed with water. It was dried to afford an off-white solid (2.1 g). ¹H NMR (DMSO-d₆ @ 120° C.) and mass spectroscopy (m/z=718) were consistent with the assigned structure.

Synthesis Example 17

This example illustrates the preparation of second host SH-3.

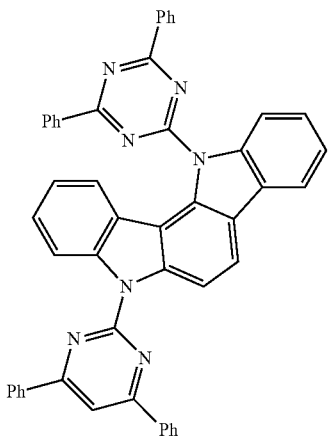

SH-3

This compound was synthesized in two steps as follows.

Step 1: Under nitrogen, a 500 mL round bottom flask equipped with a magnetic stirbar was charged with sodium hydride (0.49 g, 20.4 mmol) and 30 mL of DMF. To the resulting stirred suspension was added indolo[3,2-a]carbazole (2.49 g, 9.71 mmol) in 30 mL DMF over a period of 10 min. Gas evolution and a slight exotherm were noted. The mixture was stirred for 1 h and 2-chloro-4,6-diphenylpyrimidine (2.67 g, 10.0 mmol) in 70 mL of DMF was then added over a 20 min period. After stirring for 4.5 h, TLC showed significant reaction had occurred but some starting indolocarbazole remained. An additional 0.20 equiv of sodium hydride was added to the mixture. After 22 h, no remaining indolocarbazole was observed. The reaction mixture was treated dropwise with 66 ml of water with stirring. The mixture was stirred as a precipitate formed slowly. The precipitate was filtered off, washed with water, and dried under high vacuum overnight to afford 3.20 g of a yellow solid. ¹H NMR was consistent with the structure below, which was further confirmed by xray crystallography.

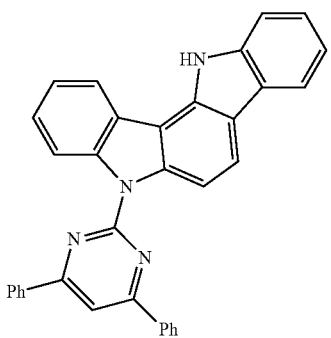 [SMILES: c1ccc(-c2cc(-c3ccccc3)nc(-n3c4ccccc4c4c5[nH]c6ccccc6c5ccc43)n2)cc1]

Step 2: In a nitrogen-filled glove box, sodium hydride was suspended in 30 mL. of DMF. To this was added the product of step 1 (1.52 g, 3.12 mmol) in small portions over a period of 1 min. The reaction mixture was stirred at room temperature for 1.5 h and then 87% (w/w) 2-chloro-4,6-diphenyl-1,3,5-triazine (1.00 g, 3.25 mmol) was added over a period of several min. The resulting mixture was stirred at room temperature overnight. The reaction was then quenched by careful addition of water, and the reaction mixture then added to 150 mL of water. The precipitate was stirred at room temperature for 1 h and the solid was filtered off, washed several times with water, and air dried to afford a pale yellow solid (2.20 g). The solid was dissolved in 150 ml of hot DMF. The yellow-orange solution was allowed to stand and cool to room temperature as a solid crystallized. After 18 h the solid was filtered off, washed with DMF, washed twice with water, and dried to afford 1.69 grams of a light yellow solid. ¹H NMR (DMSO-d₆ @ 120° C.) and mass spectroscopy (m/z=718) were consistent with the assigned structure.

Synthesis Example 18

This example illustrates the preparation of Compound H24, 6,7-diphenyl-5,12-bis-(3'-biphenyl)-indolo[3,2-a]carbazole.

Part 1—intermediate 1-(3'-biphenyl)indole

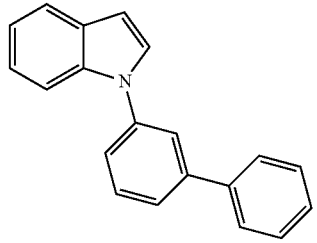 [SMILES: c1ccc(-c2cccc(-n3ccc4ccccc43)c2)cc1]

A 25 mL 3-neck round bottomed flask equipped with condenser, nitrogen inlet and thermometer, was charged with indole (937 mg, 8.00 mmol), copper(I) iodide (76 mg, 0.40 mmol, 5 mol %), and freshly ground potassium phosphate, tribasic (3.57 g, 16.80 mmol, 210 mol %). The solid mixture was flushed with nitrogen while a mixture of 3-bromobiphenyl (2.24 g, 9.60 mmol, 120 mol %), trans-N,N'-dimethylcyclohexane-1,2-diamine (228 mg, 1.60 mmol, 20 mol %) and toluene (8 mL) was pre-mixed and added to the reaction flask. The blue reaction mixture was heated to reflux. After 17 h at reflux the heterogeneous blue reaction mixture was cooled to room temperature, diluted with EtOAc (15 mL) and applied to a chromatography column and eluted with EtOAc (150 mL). The collected eluent was concentrated to an orange oil (3.25 g) that was further purified by MPLC on silica gel, eluting with 0-100% ethyl acetate in hexanes to give, after concentration by rotary evaporation, the desired product as a colorless oil (2.3 g, quant.).

Part 2—H24, 6,7-diphenyl-5,12-bis-(3'-biphenyl)-indolo[3,2-a]carbazole Trifluoromethanesulfonic acid (90 mg, 0.60 mmol, 20 mol %) was added to a solution of 1-(3'-biphenyl) indole (2.02 g, 7.50 mmol, 250 mol %) and benzil (631 mg, 3.00 mmol) in o-xylene (12 mL) in a 3-neck round-bottomed flask equipped with magnetic stir bar, condenser and nitrogen bubbler. The deep red mixture was heated at reflux for 4 h and then stirred at room temperature overnight. The heterogeneous, crude reaction mixture was applied to a pad of silica gel (60 g) and eluted with hot toluene (300 mL). The combined eluent fractions were concentrated to approximately 60 mL volume by rotary evaporation and then diluted with twice the volume of absolute ethanol and left to stand overnight. The resulting solid was collected by filtration and dried under high vacuum to give the desired product, 6,7-diphenyl-5,12-bis-(3'-biphenyl)-indolo[3,2-a]carbazole (1.16 g, 54% yield), as an orange powder. Further purification by medium pressure liquid chromatography (MPLC) on silica gel, eluting with 10-70% dichloromethane in hexanes gave a white solid (670 mg). Recrystallization of this material from toluene/absolute ethanol gave the desired product (596 mg), in 99.88% purity based on Ultra High Performance Liquid Chromatography (UPLC) analysis.

Synthesis Example 19

This example illustrates the preparation of Compound H21, 6,7-bis-(1,1':3',1"-terphenyl)-5,12-dimethyl-indolo[3,2-a]carbazole. A 250 mL 3-neck round bottomed flask equipped with condenser, thermometer, side arm stopper and magnetic stir bar was charged with 6,7-bis(4bromophenyl)-5,12-dimethyl-indolo[3,2-a]carbazole (2.38 g, 4.00 mmol; prepared according to *Org. Biomol. Chem.* 2008, 6, 1738), 3-biphenylboronic acid (1.90 g, 9.60 mmol, 240 mol %) and a quaternary ammonium salt (323 mg, 0.80 mmol, 20 mol %) were dissolved in toluene (50 mL). A solution of sodium carbonate (5.30 g, 50.0 mmol, 1,250 mol %) in $H_2O$ (25 mL) was added and the biphasic mixture was sparged with $N_2$ for approximately 30 minutes. Tetrakis(triphenylphosphine (231 mg, 0.20 mmol, 5 mol %) was added and the reaction mixture was heated to reflux (Ti=86° C.). After 19 h at reflux the reaction mixture was cooled to room temperature, the layers were separated and the aqueous layer was extracted with toluene (3×30 mL). The combined organic layer was dried over $MgSO_4$, filtered and concentrated to give the crude product as a light brown solid (7.10 g) that was redissolved in toluene (25 mL) and applied to a pad of silica gel (50 g) that was eluted with hot toluene. The eluent was concentrated to near-dryness and the solid obtained was triturated with methanol at bath temperature 75° C. for 2 h, then collected by filtration and washed with room temperature methanol (50 mL). UPLC analysis of the resulting white powder showed a purity of 94.5%. Recrystallization from toluene (45 mL) and absolute ethanol (100 mL) gave 1.80 g (61% yield) of product with a purity of 97%. Two successive medium pressure liquid chromatographies (silica gel with mobile phases of 0-100% $CHCl_3$ in hexanes and hexanes/THF, respectively) followed by a final recrystallization from $CHCl_3$/absolute ethanol gave the desired product (1.60 g) as a white solid of 98.2% purity based on UPLC analysis.

Synthesis Example 20

This example illustrates the preparation Compound H22, 5,6,12-trimethyl-7-phenyl-indolo[3,2-a]carbazole, and Compound H23, 5,7,12-trimethyl-6-phenyl-indolo[3,2-a]carbazole.

1-Methylindole (2.46 g, 18.8 mmol, 250 mol %) was added to a dark brown solution of 1-phenyl-1,2-propanedione (1.11 g, 7.50 mmol) and trifluoromethanesulfonic acid (226 mg, 1.50 mmol, 20 mol %) in toluene (30 mL). The reaction was heated at reflux overnight. After 19 h at reflux the reaction mixture was cooled to room temperature and applied to a pad of silica gel that was eluted with hot toluene (300 mL). The combined eluent fractions were concentrated to give the crude product as a yellow solid (4.40 g). The crude product was purified by MPLC on silica gel, eluting with a gradient of 0-100% dichloromethane in hexanes. Fractions from the first eluting product peak were combined and concentrated to give a white solid (499 mg, 18% yield) that had a purity of 92% by UPLC analysis. Fractions from the second eluting product peak were combined and concentrated to give a white solid (1.16 g, 41% yield) that had a purity of 79% by UPLC analysis. Both fractions were further purified separately by dissolving in toluene and applying to silica gel pads (30 g each) and eluting with hot toluene. The eluent fractions were concentrated to near saturation and approximately twice the volume of absolute ethanol was added in each case. The solutions were allowed to stand at room temperature overnight. The resulting solids we each collected separately by filtration.

The recrystallized major product (754 mg; from the second eluting peak of the above MPLC purification) had a purity of 99.57% by UPLC analysis. The identity of the major product was assigned to that of Compound H22 (5,6,12-trimethyl-7-phenyl-indolo[3,2-a]carbazole) based on x-ray crystallographic analysis.

The recrystallized minor product (246 mg; from the first eluting peak of the above MPLC purification) had a purity of 99.75% by UPLC analysis. The identity of the minor product was assigned to be that of Compound H23 (5,7,12-trimethyl-6-phenyl-indolo[3,2-a]carbazole) based on x-ray crystallographic analysis of the major product.

Synthesis Example 21

This example illustrates how Compound H27 could be prepared.

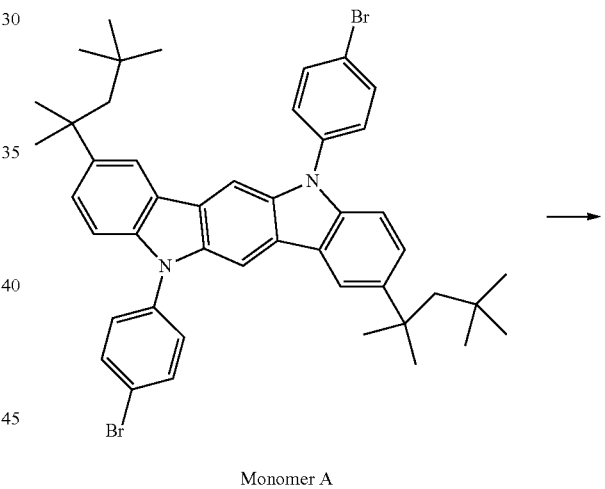

Monomer A

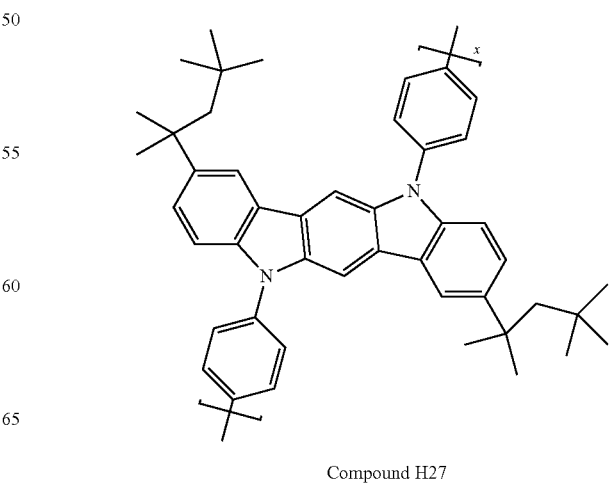

Compound H27

All operations will be carried out in a nitrogen purged glovebox unless otherwise noted. Monomer A (0.50 mmol) will be added to a scintillation vial and dissolved in 20 mL toluene. A clean, dry 50 mL Schlenk tube will be charged with bis(1,5-cyclooctadiene)nickel(0) (1.01 mmol). 2,2'-Dipyridyl (1.01 mmol) and 1,5-cyclooctadiene (1.01 mmol) will be weighed into a scintillation vial and dissolved in 5 mL N,N'-dimethylformamide. The solution will be added to the Schlenk tube. The Schlenk tube will be inserted into an aluminum block and the block heated on a hotplate/stirrer at a setpoint that results in an internal temperature of 60° C. The catalyst system will be held at 60° C. for 30 minutes. The monomer solution in toluene will be added to the Schlenk tube and the tube will be sealed. The polymerization mixture will be stirred at 60° C. for six hours. The Schlenk tube will then removed from the block and allowed to cool to room temperature. The tube will removed from the glovebox and the contents will be poured into a solution of conc. HCl/MeOH (1.5% v/v conc. HCl). After stirring for 45 minutes, the polymer will collected by vacuum filtration and dried under high vacuum. The polymer will be purified by successive precipitations from toluene into HCl/MeOH (1% v/v conc. HCl), MeOH, toluene (CMOS grade), and 3-pentanone.

Synthesis Example 22

Second host, SH-4 has the formula below and was made using a procedure analogous to Example 1 in copending U.S. application [UC0982].

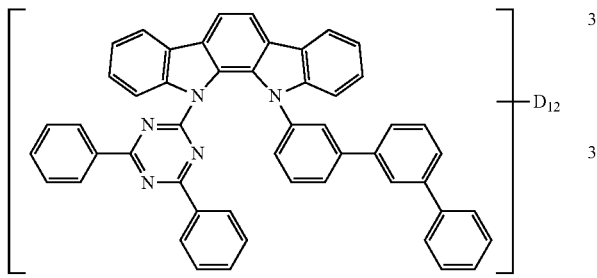

Synthesis Example 23

This example illustrates the preparation of second host SH-5, shown below.

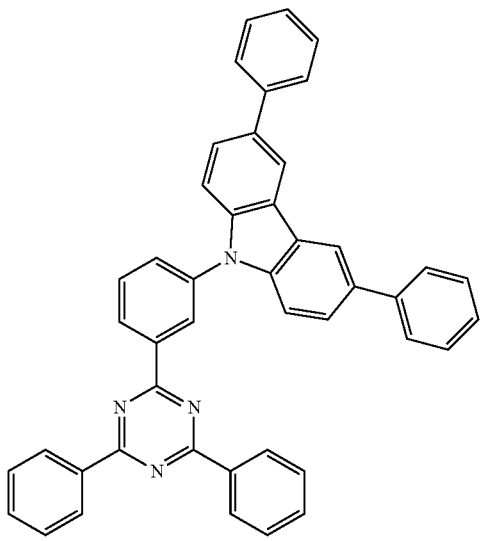 [SMILES: c1ccc(-c2ccc3c(c2)c2cc(-c4ccccc4)ccc2n3-c2cccc(-c3nc(-c4ccccc4)nc(-c4ccccc4)n3)c2)cc1]

The compound was made according to the following scheme:

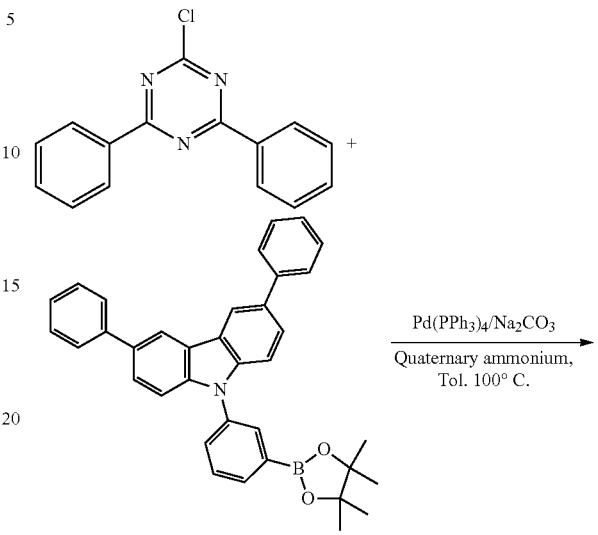

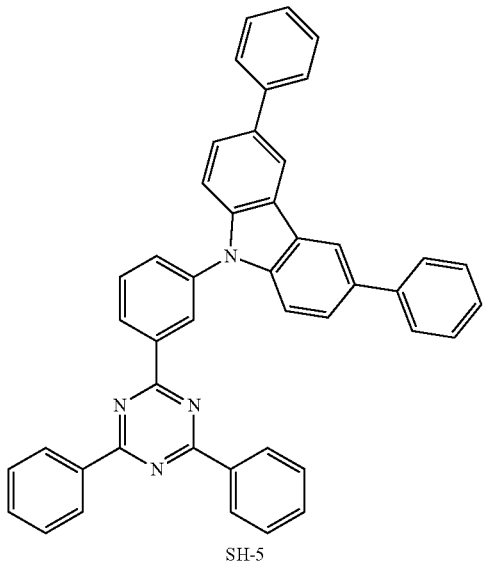

SH-5

2-Chloro-4,6-diphenyl-1,3,5-triazine (5.5 g, 20.54 mmol), 3,6-diphenyl-9-(3-(4,4,5,5-tetramethyl-1,3,2-dioxaborolan-2-yl)phenyl)-9H-carbazole (11.249 g, 21.57 mmol), sodium carbonate (10.888 g, 102.72 mmol), quaternary ammonium salt (0.570 g), toluene (114 mL) and water (114 mL) were added to a 500 mL two necked flask. The resulting solution was sparged with $N_2$ for 30 minutes. After sparging, tetrakis(triphenylphosphine)Pd(0) (1.187 g, 1.03 mmol) was added as a solid to the reaction mixture which was further sparged for 10 minutes. The mixture was then heated to 100 C for 16 hrs. After cooling to room temperature the reaction mixture was diluted with dichloromethane and the two layers were separated. The organic layer was dried over $MgSO_4$. The product was purified by column chromatography using silica and dicholoromethane:hexane (0-60% gradient). Compound SH-5 was recrystallized from chloroform/acetonitrile. The final material was obtained in 75% yield (9.7 g) and 99.9% purity. The structure was confirmed by $^1H$ NMR anaylsis.

Synthesis Example 23

This example illustrates the preparation of second host SH-6, shown below.

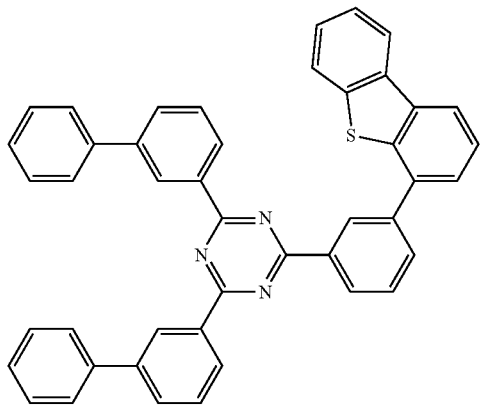 [SMILES: c1ccc(-c2cccc(-c3nc(-c4cccc(-c5ccccc5)c4)nc(-c4cccc(-c5cccc6c5sc5ccccc56)c4)n3)c2)cc1]

A 500 mL one-neck round-bottom flask equipped with a condenser and nitrogen inlet was charged with 5.55 g (26.1 mmol) of potassium phosphate and 100 mL of DI water. To this solution, 6.74 g (17.44 mmol) of 2-(3-(dibenzo[b,d]thiophen-4-yl)phenyl)-4,4,5,5-tetramethyl-1,3,2-dioxaborolane, 6.1 g (14.53 mmol) of 2,4-di(biphenyl-3-yl)-6-chloro-1,3,5-triazine, and 160 mL of 1,4-dioxane were added. The reaction mixture was sparged with nitrogen for 35 minutes. In the drybox, 0.4 g (0.44 mmol) of tris(dibenzylideneacetone)dipalladium(0) and 0.28 g (1.15 mmol) of tricyclohexylphosphine were mixed together in 40 mL of 1,4-dioxane, taken out of the box and added to the reaction mixture. Reaction mixture was sparged nitrogen for five minutes then refluxed for 18 hours. The reaction was cooled to room temperature and 1,4-dioxane was removed on the rotary evaporator. The residue was diluted with methylene chloride and water, then brine was added to the mixture, which was let to stand for 30 minutes. Lower level was removed along with gray solids. The aqueous layer was extracted two more times with methylene dichloride. The combined organic layers were stripped until dry. The resulting gray solid was placed on a filter paper at the bottom of a coarse fritted glass funnel and washed with 100 mL of water, 800 mL of LC grade methanol and 500 mL of diethyl ether. Solids were recrystallized from minimal amount of hot toluene. Yield 5.48 g (59%) of desired product. Mass spectrometry and $^1$H NMR (CDCl$_2$CCl$_2$D) data were consistent with the structure of the desired product.

Synthesis Example 24

This example illustrates the synthesis of Compound H19: 5,12-bis(3-(pyridin-2-yl)phenyl)-5,12-dihydroindolo[3,2-a]carbazole.

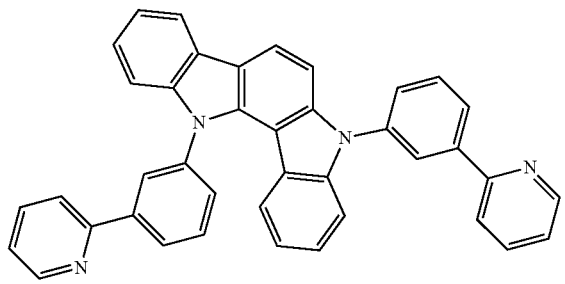 [SMILES: c1ccc(-c2cccc(-n3c4ccccc4c4c3ccc3c5ccccc5n(-c5cccc(-c6ccccn6)c5)c34)c2)nc1]

The compound was prepared in two steps as follows.
Step 1: [Synthesis of 2-(3-bromophenyl)pyridine]

2-iodopyridine (7.60 g, 37.0 mmol) was dissolved in 1,2 dimethoxyethane (90 ml) under nitrogen and treated with 3-bromophenylboronic acid (7.45 g, 37.0 mmol) followed by tetrakis(triphenylphosphine)palladium (1.28 g, 1.11 mmol). The mixture was stirred at room temperature and then treated with 37 ml of 2.0 M aq. potassium carbonate. The mixture was degassed with a stream of nitrogen for 30 min and then stirred and heated at reflux under nitrogen for 18 h. The reaction was not complete at this point, so an additional 0.86 g (0.74 mmol) of tetrakis(triphenylphosphine)palladium was added to the mixture, followed by 1.5 g (7.4 mmol) of 3-bromophenylboronic acid and 2.05 g (15 mmol) of potassium carbonate in 7.5 ml of water. Reflux under nitrogen was continued for an additional 18 h. The reaction mixture was cooled to room temperature, poured into 500 ml of water, and extracted 3 times with diethyl ether. The combined ether extracts were washed with water, dried over anhydrous sodium sulfate, filtered, and concentrated to afford 11.78 g of an amber oil. This material was purified using ethyl acetate/hexane as the eluent on a Biotage® automated flash purification system. This afforded 7.03 g of 2-(3-bromophenyl)pyridine as a clear colorless oil, contaminated with unreacted 2-iodopyridine (which co-eluted). The oil was further purified by kugelrohr distillation. Unreacted 2-iodopyridine was observed to distill at 85-89° C. @ 0.06 mm, leaving behind 5.17 g of a clear colorless oil. $^1$H NMR indicated this to be 2-(3-bromophenyl)pyridine, contaminated by ~2.5 mole % 2-iodopyridine. Further Kugelrohr distillation of a 3.25 g sample resulted in isolation of 3.00 g of 2-(3-bromophenyl)pyridine, contaminated by ~1.7 mole % of remaining 2-iodopyridine.

Step 2:

In a nitrogen-filled glovebox, indolo[3,2-a] carbazole (1.60 g, 6.24 mmol) was suspended in 91 ml of xylenes and treated with 2-(3-bromophenyl)-pyridine (2.98 g, 12.7 mmol) followed by sodium t-butoxide (1.80 g, 18.7 mmol). The mixture was stirred and treated with the tri-t-butylphosphine (0.202 g, 1.00 mmol) followed by tris(dibenzylideneacetone)dipalladium(0) (0.458 g, 0.50 mmol). The suspension was stirred and warmed over a 20 minute period to 128-130° C. to afford a reddish brown suspension. Heating was discontinued after 1 h and the reaction mixture cooled to room temperature. The reaction mixture was filtered through a short pad of silica gel. The pad was washed several times with toluene and ethyl acetate, and the filtrates concentrated under vacuum. The crude product was purified using ethyl acetate/hexane as the eluent on a Biotage® automated flash purification system. The purest fractions were combined and concentrated to afford 2.33 g of a yellow glass. This material was further purified by reprecipitation twice from toluene/ethanol to afford 1.68 g of Compound H19 as a light yellow solid after drying. $^1$H NMR and mass spectroscopy were consistent with the assigned structure.

Device Examples (1) Materials

D68 is a green dopant which is a tris-phenylpyridine complex of iridium, having phenyl substituents.

ET-1 is an electron transport material which is a metal quinolate complex.

HIJ-1 is a hole injection material which is made from an aqueous dispersion of an electrically conductive polymer and a polymeric fluorinated sulfonic acid. Such materials have been described in, for example, published U.S. patent applications US 2004/0102577, US 2004/0127637, and US 2005/0205860, and published PCT application WO 2009/018009.

HT-1, HT-2, and HT-3 are hole transport materials which are triarylamine polymers. Such materials have been described in, for example, published PCT application WO 2009/067419 and copending application [UC1001].

(2) Device Fabrication

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent. After cooling, the substrates were then spin-coated with a toluene solution of HT-1, and then heated to remove solvent. After cooling the substrates were spin-coated with a methyl benzoate solution of the host and dopant, and heated to remove solvent. The substrates were masked and placed in a vacuum chamber. A layer of ET-1 was deposited by thermal evaporation, followed by a layer of CsF. Masks were then changed in vacua and a layer of Al was deposited by thermal evaporation. The chamber was vented, and the devices were encapsulated using a glass lid, dessicant, and UV curable epoxy.

(3) Device Characterization

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The color coordinates were determined using either a Minolta CS-100 meter or a Photoresearch PR-705 meter.

Examples 1-4 and Comparative Example A

This example illustrates the device performance of a device having a photoactive layer including the new composition described above. The dopant was D20, having green emission color. The first host compound for each example is given below. The second host compound was SH-4.

The device layers had the following thicknesses:
anode=ITO=50 nm
hole injection layer=HIJ-1=50 nm
hole transport layer=HT-1=20 nm
photoactive layer (discussed below)=60 nm
electron transport layer=ET-1=10 nm
electron injection layer/cathode=CsF/Al=0.7 nm/100 nm In Example 1, the photoactive layer was Compound H4: SH-4:D20 in a weight ratio of 35:49:16.

In Example 2, the photoactive layer was Compound H17: SH-4:D20 in a weight ratio of 35:49:16.

In Example 3, the photoactive layer was Compound H10: SH-4:D20 in a weight ratio of 35:49:16.

In Example 4, the photoactive layer was Compound H11: SH-4:D20 in a weight ratio of 35:49:16.

In Comparative Example A, a single host was used and there was no host having a unit of Formula I. The photoactive layer was SH-4: D20 in a weight ratio of 84:16.

The device results are given in Table 1 below.

TABLE 1

Device results

| Ex. | CIE (x, y) | Voltage (V) | C.E. (cd/A) | E.Q.E. (%) | Projected Lifetime T50 @1000 nits |
|---|---|---|---|---|---|
| Comp. A | 0.319, 0.633 | 3.5 | 70.7 | 19.2 | 118,155 |
| Ex. 1 | 0.314, 0.637 | 3.8 | 66.4 | 18.0 | 191,889 |
| Ex. 2 | 0.318, 0.635 | 3.8 | 69.1 | 18.7 | 232,044 |
| Ex. 3 | 0.318, 0.635 | 3.7 | 66.0 | 17.9 | 200,148 |
| Ex. 4 | 0.315, 0.636 | 3.8 | 71.2 | 19.3 | 220,533 |

All data @ 1000 nits, CE = current efficiency; CIEx and CIEy are the x and y color coordinates according to the C.I.E. chromaticity scale (Commission Internationale de L'Eclairage, 1931). Projected T50 is the time in hours for a device to reach one-half the initial luminance at 1000 nits, calculated using an acceleration factor of 1.8.

It can be seen from Table 1 that the lifetime is greatly increased when the device has the composition described herein.

Example 5, Comparative Example B and Comparative Example D

This example illustrates the device performance of a device having a photoactive layer including the new composition described above. The dopant was a combination of dopants resulting in white emission.

In Example 5, the first host was H4 (60% by weight) and the second host was SH-6 (23% by weight).

In Comparative Example B, only the second host, SH-6, was present (83% by weight).

In Comparative Example 0, only the first host, H4, was present (83% by weight).

The compositions of the photoactive layers are given in Table 2a below. The weight percentages are based on the total weight of the photoactive layer.

The device layers had the following thicknesses:
anode=ITO=120 nm
hole injection layer=HIJ-1=50 nm
hole transport layer=HT-2=20 nm
photoactive layer (discussed above)=50 nm
electron transport layer=ET-1=10 nm
electron injection layer/cathode=CsF/Al=0.7 nm/100 nm The device results are given in Table 2b below.

TABLE 2a

Photoactive Layer

| | Dopant (weight %) | | | Host (weight %) | |
|---|---|---|---|---|---|
| Example | D39 | D68 | D9 | H4 | SH-6 |
| Comparative Example B | 16.0 | 0.13 | 0.8 | 0 | 83.07 |
| Comparative Example D | 16.0 | 0.16 | 0.7 | 83.14 | 0 |
| Example 5 | 16.0 | 0.13 | 0.8 | 60 | 23 |

TABLE 2b

| | Device results | | |
|---|---|---|---|
| Ex. | CIE (x, y) | P.E. (lm/W) | E.Q.E. (%) |
| Comparative B | 0.51, 0.42 | 9.3 | 7.2 |
| Comparative D | 0.52, 0.38 | 0.26 | 0.45 |
| Example 5 | 0.51, 0.41 | 18 | 13.5 |

All data @ 1000 nits, PE = power efficiency; CIEx and CIEy are the x and y color coordinates according to the C.I.E. chromaticity scale (Commission Internationale de L'Eclairage, 1931).

It can be seen from Table 2 that the efficiency is greatly increased when the host having at least one unit of Formula I is present with the second host.

Example 6

This example illustrates another OLED device with the composition described herein.

The device was made as in Example 5, except that the first host was Compound H11 and the photoactive layer thickness was 64 nm.

The results are as follows:

EQE=8.4%

PE=13 lm/W

CIE x,y=0.41, 0.444 where the abbreviations have the same meaning as in Example 5.

Example 7 and Comparative Example C

This example illustrates the device performance of a device having a photoactive layer including the new composition described above. The dopant was D39 (16% by weight) a combination of dopants resulting in white emission. The photoactive layer was 16% by weight O39, 0.13% by weight D68, and 0.8% by weight D9.

In Example 7, the first host was H4 (60% by weight) and the second host was SH-5 (24% by weight).

In Comparative Example C, the second host SH-5 (24% by weight) was combined with a commonly used carbazole host (60% by weight) shown below.

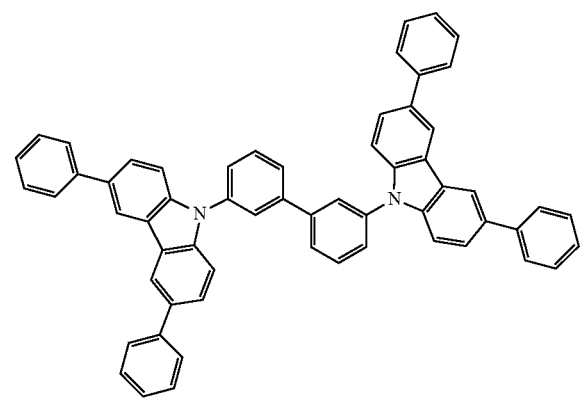 [SMILES: c1ccc(-c2ccc3c(c2)c2cc(-c4ccccc4)ccc2n3-c2cccc(-c3cccc(-n4c5ccc(-c6ccccc6)cc5c5cc(-c6ccccc6)ccc54)c3)c2)cc1]

The weight percentages are based on the total weight of the photoactive layer.

The device results are given in Table 3.

TABLE 3

| | Device results | | |
|---|---|---|---|
| Example | CIE (x, y) | P.E. (lm/W) | E.Q.E. (%) |
| Comparative C | 0.158, 0.368 | 9.0 | 6.2 |
| Example 7 | 0.148, 0.313 | 17.1 | 9.8 |

All data @ 1000 nits, PE = power efficiency; CIEx and CIEy are the x and y color coordinates according to the C.I.E. chromaticity scale (Commission Internationale de L'Eclairage, 1931).

It can be seen from Table 3, that when Compound H4 is present as the first host the device efficiency is greater than when the carbazole compound is used as the first host.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A composition comprising (a) a dopant capable of electroluminescence having an emission maximum between 380 and 750 nm, (b) a first host compound, wherein the first host compound has Formula IV

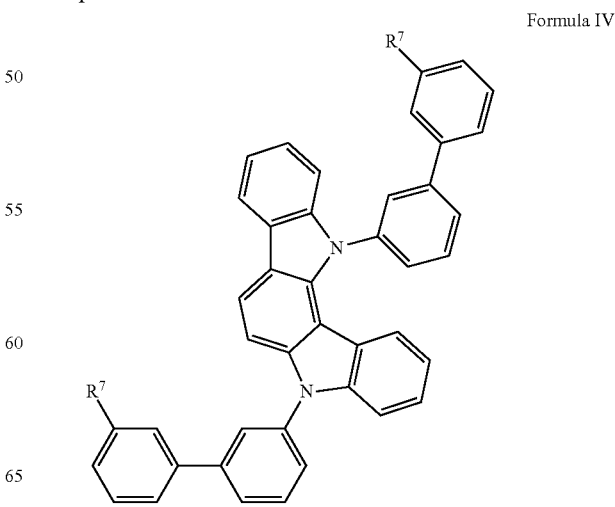

Formula IV where R⁷ is H, D, phenyl, or deuterated phenyl;
and (c) a second host compound.

2. The composition of claim 1, wherein the second host is at least 10% deuterated.

3. The composition of claim 1, wherein the second host is a triazine, an indolocarbazole having an N-heterocycle substituent, or a deuterated analog thereof.

4. An organic electronic device comprising a first electrical contact layer, a second electrical contact layer, and a photoactive layer therebetween, wherein the photoactive layer comprises (a) a dopant capable of electroluminescence having an emission maximum between 380 and 750 nm, (b) a first host compound having Formula IV

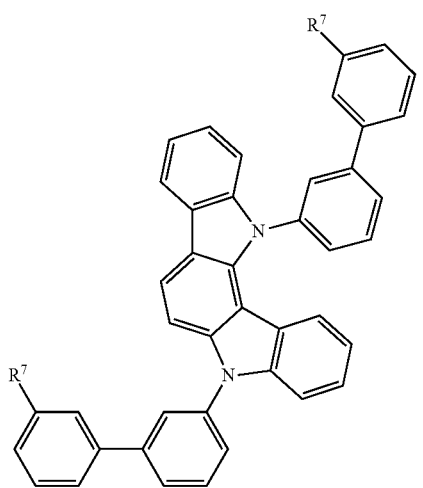

Formula IV where R⁷ is H, D, phenyl, or deuterated phenyl;and
(c) a second host compound.

5. The device of claim 4, wherein the dopant is a luminescent organometallic complex.

6. The device of claim 4, wherein the organometallic complex is a cyclometalated compex of iridium or platinum.

7. The device of claim 4, wherein the second host is a triazine, an indolocarbazole having an N-heterocycle substituent, or a deuterated analog thereof.

8. The device of claim 4, wherein the second host compound has Formula V

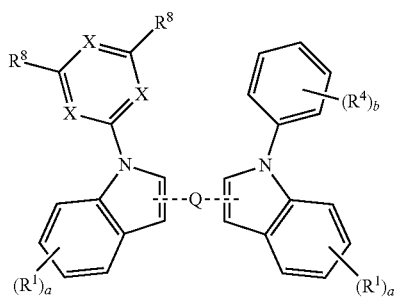

Formula V wherein:
Q is a fused ring linkage having the formula

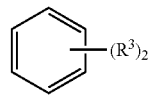

R¹ is the same or different at each occurrence and is D, alkyl, aryl, silyl, alkoxy, aryloxy, cyano, vinyl, or allyl;

R³ is the same or different at each occurrence and is H, D, cyano, alkyl, or aryl;

R⁴ is the same or different at each occurrence and is D, aryl, silyl, alkoxy, aryloxy, cyano, vinyl, allyl, dialkylamino, diarylamine, carbazole, pyridine, pyrimidine, triazine, dibenzothiophene, dibenzopyran, or a deuterated analog thereof;

R⁸ is the same or different at each occurrence and is H, D, alkyl, or aryl, or R⁸ may form a fused 5- or 6-membered ring;

X is the same or different at each occurrence and is CH or N, with the proviso that at least one X is N;

a is the same or different at each occurrence and is an integer from 0-4; and b is the same or different at each occurrence and is an integer from 0-5.

9. The device of claim 4, wherein the second host compound has Formula VI

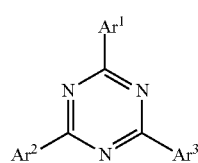

Formula VI wherein Ar¹, Ar², and Ar³ are the same or different and are H, D, or aryl groups, with the proviso that at least two of Ar¹, Ar², and Ar³ are aryl groups.

10. The device of claim 4, wherein the photoactive layer consists essentially of (a) a dopant capable of electroluminescence having an emission maximum between 380 and 750 nm and (b) a host compound having Formula IV, and (c) a second host compound.

* * * * *